United States Patent
Yarus et al.

(10) Patent No.: US 11,250,182 B2
(45) Date of Patent: Feb. 15, 2022

(54) TARGET OBJECT SIMULATION USING ORBIT PROPAGATION

(71) Applicant: Landmark Graphics Corporation, Houston, TX (US)

(72) Inventors: Jeffrey Marc Yarus, Houston, TX (US); Rae Mohan Srivastava, Toronto (CA); Genbao Shi, Sugar Land, TX (US); Veronica Liceras, Katy, TX (US); Yogendra Narayan Pandey, Houston, TX (US); Zhaoyang Wang, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 909 days.

(21) Appl. No.: 15/762,668

(22) PCT Filed: Nov. 10, 2015

(86) PCT No.: PCT/US2015/059864
§ 371 (c)(1),
(2) Date: Mar. 23, 2018

(87) PCT Pub. No.: WO2017/082871
PCT Pub. Date: May 18, 2017

(65) Prior Publication Data
US 2019/0080032 A1    Mar. 14, 2019

(51) Int. Cl.
*G06F 30/20* (2020.01)
*G06F 30/23* (2020.01)
(Continued)

(52) U.S. Cl.
CPC ............ *G06F 30/20* (2020.01); *G01V 99/005* (2013.01); *G06F 30/23* (2020.01); *G06T 17/05* (2013.01); *G06T 17/20* (2013.01); *G01V 99/00* (2013.01)

(58) Field of Classification Search
CPC ....... G06F 30/20; G06F 30/23; G01V 99/005; G01V 99/00; G06T 17/05; G06T 17/20
(Continued)

(56) References Cited

U.S. PATENT DOCUMENTS

| 6,968,299 B1 | 11/2005 | Bernardini et al. |
| 2002/0032550 A1 | 3/2002 | Ward et al. |

(Continued)

FOREIGN PATENT DOCUMENTS

| WO | WO 2011/062671 A1 | 5/2011 |
| WO | WO 2015/030809 A1 | 3/2015 |
| WO | WO 2015/077768 A1 | 5/2015 |

OTHER PUBLICATIONS

International Search Report and The Written Opinion of the International Search Authority, or the Declaration, dated Jul. 26, 2016, PCT/US2015/059871, 11 pages, ISA/KR.
(Continued)

*Primary Examiner* — Justin C Mikowski
(74) *Attorney, Agent, or Firm* — Haynes and Boone, LLP

(57) ABSTRACT

Target objects are simulated using different triangle mesh sizes to improve processing performance. To perform the simulation, a seed point for the target object within a constraint volume is determined, the seed point representing a vertex of a first triangle forming part of the target object. One or more hexagonal orbits of triangles adjacent the first triangle are propagated, whereby the hexagonal orbits of triangles form the target object. The size of each triangle is determined based upon dimensions of the target object, and the target object is generated.

11 Claims, 29 Drawing Sheets

(51) Int. Cl.
  *G01V 99/00* (2009.01)
  *G06T 17/05* (2011.01)
  *G06T 17/20* (2006.01)
(58) Field of Classification Search
  USPC .............................................................. 703/6
  See application file for complete search history.

(56) References Cited

U.S. PATENT DOCUMENTS

| | | | |
|---|---|---|---|
| 2010/0054579 A1* | 3/2010 | Okutomi | G01C 11/06 382/154 |
| 2010/0138196 A1 | 6/2010 | Hui et al. | |
| 2011/0029293 A1 | 2/2011 | Petty et al. | |
| 2011/0125471 A1* | 5/2011 | Craig | G01V 1/42 703/6 |
| 2012/0221302 A1 | 8/2012 | Lewandowski et al. | |
| 2013/0035913 A1 | 2/2013 | Mishev et al. | |
| 2013/0148168 A1* | 6/2013 | Bernal | G06T 1/0028 358/3.06 |
| 2013/0226530 A1* | 8/2013 | Onodera | G06T 17/20 703/1 |
| 2013/0271463 A1 | 10/2013 | Curington et al. | |
| 2014/0098090 A1* | 4/2014 | Schmidt | G06T 17/20 345/419 |
| 2014/0305638 A1 | 10/2014 | Kresse et al. | |

OTHER PUBLICATIONS

International Search Report and The Written Opinion of the International Search Authority, or the Declaration, dated Jul. 28, 2016, PCT/US2015/059859, 15 pages, ISA/KR.
International Search Report and The Written Opinion of the International Search Authority, or the Declaration, dated Aug. 3, 2016, PCT/US2015/059864, 13 pages, ISA/KR.
Extended Search Report issued for European Patent Application No. 15908419.3, dated Jun. 7, 2019, 7 pages.
Examination Report issued for European Patent Application No. 15908419.3, dated Feb. 24, 2021, 5 pages.

* cited by examiner

TARGET OBJECT SIMULATION USING ORBIT PROPAGATION

PRIORITY

The present application is a U.S. National Stage patent application of International Patent Application No. PCT/US2015/059864, filed on Nov. 10, 2015, the benefit of which is claimed and the disclosure of which is incorporated herein by reference in its entirety.

FIELD OF THE DISCLOSURE

The present disclosure relates generally to the field of hydrocarbon reservoir simulation and, more specifically, to techniques for reducing memory requirements during simulations though the utilization of different triangle mesh sizes.

BACKGROUND

Software applications for large-scale data analysis and visualization have become essential tools for achieving business objectives in many industries. Such applications are generally used to quickly process large quantities of data to enable the data to be visualized or searched to find key insights, patterns, and important details about the data itself. In the oil and gas industry, such applications may be used to simulate natural fracture networks in unconventional petroleum reservoirs in order to gain a better understanding of the reservoir's physical composition, as well as its economic potential for hydrocarbon exploration and production. The computer models may be generated based on, for example, seismic data representative of the subsurface geological features including, but not limited to, structural unconformities, faults, and folds within different stratigraphic layers of the reservoir formation. In addition to fracture modeling, the computer models may be used by petroleum engineers and geoscientists to visualize two-dimensional (2D), three-dimensional (3D), or four-dimensional (4D) representations of particular stratigraphic features of interest and to simulate the flow of petroleum or other fluids within the reservoir.

However, conventional fracture network simulations require a large amount of memory in order to store the mesh data, especially when the triangle meshes are small. Such memory requirements can easily stress or exceed RAM capacity, often effecting overall performance of the system or even initiating a system failure.

DESCRIPTION OF ILLUSTRATIVE EMBODIMENTS

Illustrative embodiments and related methods of the present disclosure are described below as they might be employed to simulate fracture networks having differing mesh sizes. In the interest of clarity, not all features of an actual implementation or methodology are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure. Further aspects and advantages of the various embodiments and related methodologies of the disclosure will become apparent from consideration of the following description and drawings.

As described herein, illustrative embodiments and methods of the present disclosure generate and adjust triangle mesh sizes based upon the size of each fracture in the simulated natural fracture network. In doing so, the disclosed system generates a large triangle mesh size for large fractures, and a smaller triangle mesh size for small fractures. As a result, the system easily generates large fracture networks without taxing the memory capacity, which, in turn, also improves the overall simulation performance dramatically.

In a generalized method of the present disclosure, input data defining parameters of the fractures in the fracture network are received by the system. Such parameters may include, for example, the orientation and size of the fractures, fracture sets, fracture seed points, and the bounds of the fracture network. Using the input parameters, the system then determines a first (e.g., large) and second (e.g., smaller)

triangle mesh size for the fractures, and the fracture network is simulated using the large and small triangle mesh sizes.

It will be apparent to one of ordinary skill in the relevant art that the embodiments, as described herein, can be implemented in many different embodiments of software, hardware, firmware, or a combination thereof and may be implemented in one or more computer systems or other processing systems. Any actual software code used for the specialized control of hardware to implement embodiments is not limiting of the detailed description. Thus, the operational behavior of embodiments will be described with the understanding that modifications and variations of the embodiments are possible, given the level of detail presented herein.

Figure 1:
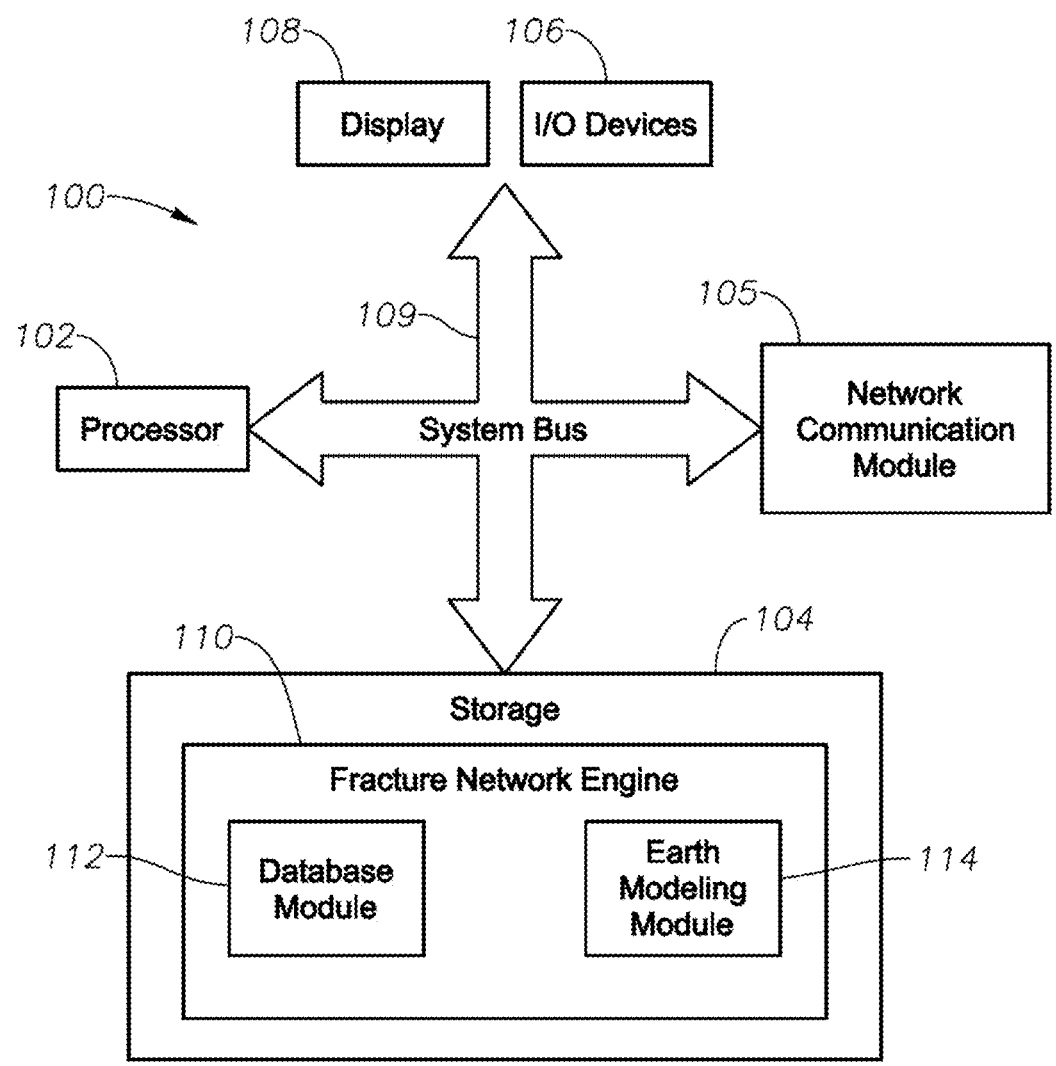
FIG. 1 is a block diagram of a fracture network simulation system, according to certain illustrative embodiments of the present disclosure.

Referring to FIG. 1, an illustrative fracture network simulation system 100 is shown which includes at least one processor 102, a non-transitory, computer-readable storage 104, transceiver/network communication module 105, optional I/O devices 106, and an optional display 108 (e.g., user interface), all interconnected via a system bus 109. Software instructions executable by the processor 102 for implementing software instructions stored within fracture network engine 110 in accordance with the illustrative embodiments described herein, may be stored in storage 104 or some other computer-readable medium. Although not explicitly shown in FIG. 1, it will be recognized that fracture network simulation system 100 may be connected to one or more public and/or private networks via one or more appropriate network connections. It will also be recognized that the software instructions comprising fracture network engine 110 may also be loaded into storage 104 from a CD-ROM or other appropriate storage media via wired or wireless methods.

Moreover, those ordinarily skilled in the art will appreciate that the invention may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present invention. The invention may be practiced in distributed-computing environments where tasks are performed by remote-processing devices that are linked through a communications network. In a distributed-computing environment, program modules may be located in both local and remote computer-storage media, including any known memory storage devices. The present invention may therefore, be implemented in connection with various hardware, software or a combination thereof in a computer system or other processing system.

Still referring to FIG. 1, in certain illustrative embodiments, fracture network engine 110 comprises database module 112 and earth modeling module 114. Database module 112 provides robust data retrieval and integration of historical and real-time reservoir related data that spans across all aspects of the well planning, construction and completion processes such as, for example, drilling, cementing, wireline logging, well testing and stimulation. Moreover, such data may include, for example, logging data, well trajectories, petrophysical rock property data, mechanical rock property data, surface data, fault data, data from surrounding wells, data inferred from geostatistics, etc. The database (not shown) which stores this information may reside within database module 112 or at a remote location. An exemplary database platform is, for example, the INSITE® software suite, commercially offered through Halliburton Energy Services Inc. of Houston Tex. Those ordinarily skilled in the art having the benefit of this disclosure realize there are a variety of software platforms and associated systems to retrieve, store and integrate the well related data, as described herein.

Still referring to the exemplary embodiment of FIG. 1, fracture network engine 110 also includes earth modeling module 114 that integrates with the data contained within database module 112 in order to provide fracture network simulations and subsurface stratigraphic visualization including, for example, geo science interpretation, petroleum system modeling, geochemical analysis, stratigraphic gridding, facies, net cell volume, and petrophysical property modeling. In addition, earth modeling module 114 models well paths, as well as cross-sectional through the facies and porosity data. Illustrative earth modeling platforms include DecisionSpace®, which is commercially available through the Assignee of the present invention, Landmark Graphics Corporation of Houston, Tex. However, those ordinarily skilled in the art having the benefit of this disclosure realize a variety of other earth modeling platforms may also be utilized with the present invention.

Moreover, fracture network engine 110 may also include multi-domain workflow automation capabilities that may connect any variety of desired technical applications. As such, the output from one application, or module, may become the input for another, thus providing the capability to analyze how various changes impact the well placement and/or fracture design. Those ordinarily skilled in the art having the benefit of this disclosure realize there are a variety of workflow platforms which may be utilized for this purpose.

Figure 2A:
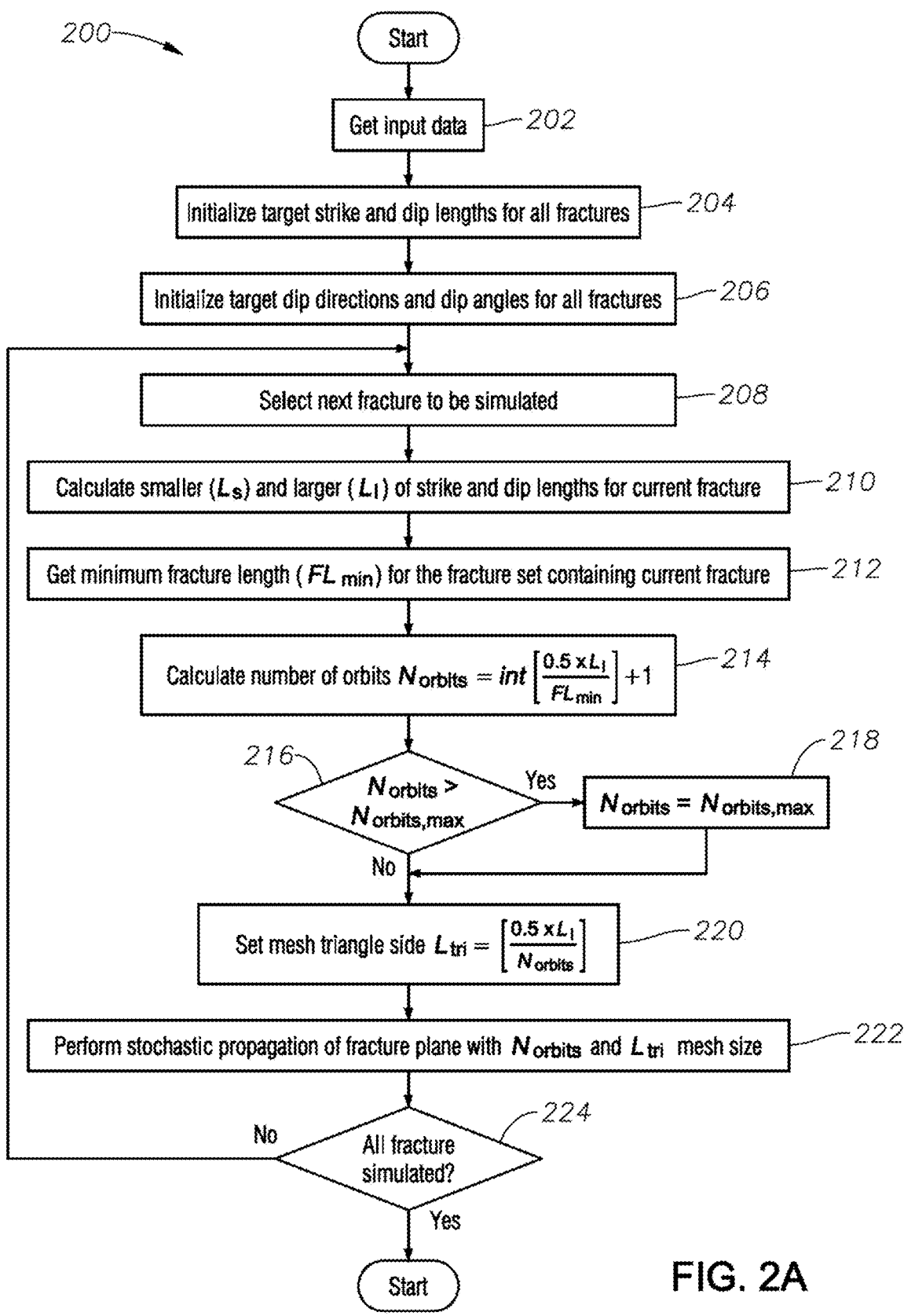
FIG. 2A is a flow chart for simulating a downhole fracture network, according to certain illustrative methods of the present disclosure.

FIG. 2A is a flow chart for simulating a downhole fracture network, according to certain illustrative methods of the present disclosure. At block 202 of method 200, input data defining various parameters of the fractures in the triangle mesh network are received by fracture network simulation system 100 via some input graphical user interface. In this example, the input parameters include an orientation and size of the fractures, ranges for fracture sets, the location of fracture seed points, and boundaries for the facture network being simulated. This data may be supplied from a number of sources, including, for example, manual entry, borehole logs, other wells, etc. Fracture sets may be defined in a number of ways, including for example, through use of a stereonet in which clusters of fractures may be defined as sets. As defined herein, a fracture seed point is a location within the fracture network whereby the fracture is originated and propagated out from; the fracture seed point could be along the wellbore or at some other location.

In certain illustrative methods described herein, natural fracture network modeling is provided for the regions bounded by surfaces, regular and stratigraphic 3D grids, and structural frameworks, as will be described in more detail below. Therefore, at block 202, in addition to the other input parameters, the desired type of bounding is also defined. The types of bounding may include bounding by surfaces that define an upper and lower boundary of the simulated fracture network region. Alternatively, the fracture network may be bound by a 3D grid or a structural framework (e.g., a fault).

After the input data has been received, fracture network simulation system 100 begins the simulation by initializing the target strike and dip lengths for all fractures in the network, at block 204. The "target" is the fracture location being simulated. As understood in the art, target strike length is the strike length of the target fracture and is inputted by the user. The target strike length is the length in the fracture strike direction which the user would like to simulate. Dip length is the fracture length in the dip direction and is also inputted by the user. At block 206, fracture network simulation system 100 then initializes the target dip directions and dip angles for all fractures.

Once blocks 204 and 206 have been performed for all fractures in the network, fracture network simulation system 100 then continues the simulation fracture-by-fracture. At block 208, fracture network simulation system 100 selects a fracture to begin further simulation. At block 210, fracture network simulation system 100 calculates a smaller ($L_S$) (i.e., minimum) and larger ($L_I$) (i.e., maximum) strike and dip length for the selected fracture. In this block, there is one strike length and one dip length per fracture. From these, a minimum and maximum strike length and maximum and minimum dip length for that particular fracture is determined. In this example, the minimum and maximum strike and dip length is user-defined.

At block 212, fracture network simulation system 100 then determines/acquires the minimum fracture length ($FL_{MIN}$) for the current fracture set containing the selected fracture from the user's input. At block 214, fracture network simulation system 100 then calculates the number of orbits for the selected fracture based upon the strike and dip lengths. As will be described in more detail below with reference to FIG. 3A, "orbits" refer to the number of triangles propagated out from a seed point during simulation. During the simulation, the fracture is grown radially out from the wellbore. The previously determined maximum strike and dip lengths has to be reached in a defined number of these circular orbits. In general, the maximum strike and dip length (i.e., max length) are equal to:

$$2(\text{\# of orbits})(\text{triangle mesh size}) \qquad \text{Eq. (1),}$$

which, in turn, gives the number of orbits equal to:

$$\text{max length}/(2*\text{triangle mesh size}) \qquad \text{Eq. (2).}$$

An initial estimate for the triangle mesh size is based upon the minimum fracture length. This minimum fracture length is based upon all fractures in the fracture set and should not be confused with the minimum strike and dip lengths.

Alternatively, at block 214, the number of orbits is calculated using:

$$N_{ORBITS} = int\left[\frac{0.5 \times L_I}{FL_{min}}\right] + 1, \qquad \text{Eq.(3)}$$

Equation 2 gives a fraction, while Equation 3 rounds the fracture to an integer number, which may be more useful in certain applications.

At block 216, fracture network simulation system 100 determines whether $N_{ORBITS}$ is greater than the maximum number of orbits (i.e., $N_{ORBITS,MAX}$) set by the strike and dip lengths. If fracture network simulation system 100 determines a "Yes," $N_{ORBITS}$ is set to the number of $N_{ORBITS,MAX}$ at block 218; and thereafter the method moves onto to block 220. If, however, fracture network simulation system 100 determines a "No," at block 220 the length of the mesh triangle side ($L_{TRI}$) is set equal:

$$\left[\frac{0.5 \times L_I}{N_{orbits}}\right], \qquad \text{Eq.(4)}$$

whereby the different size triangles are determined.

Figure 2B:
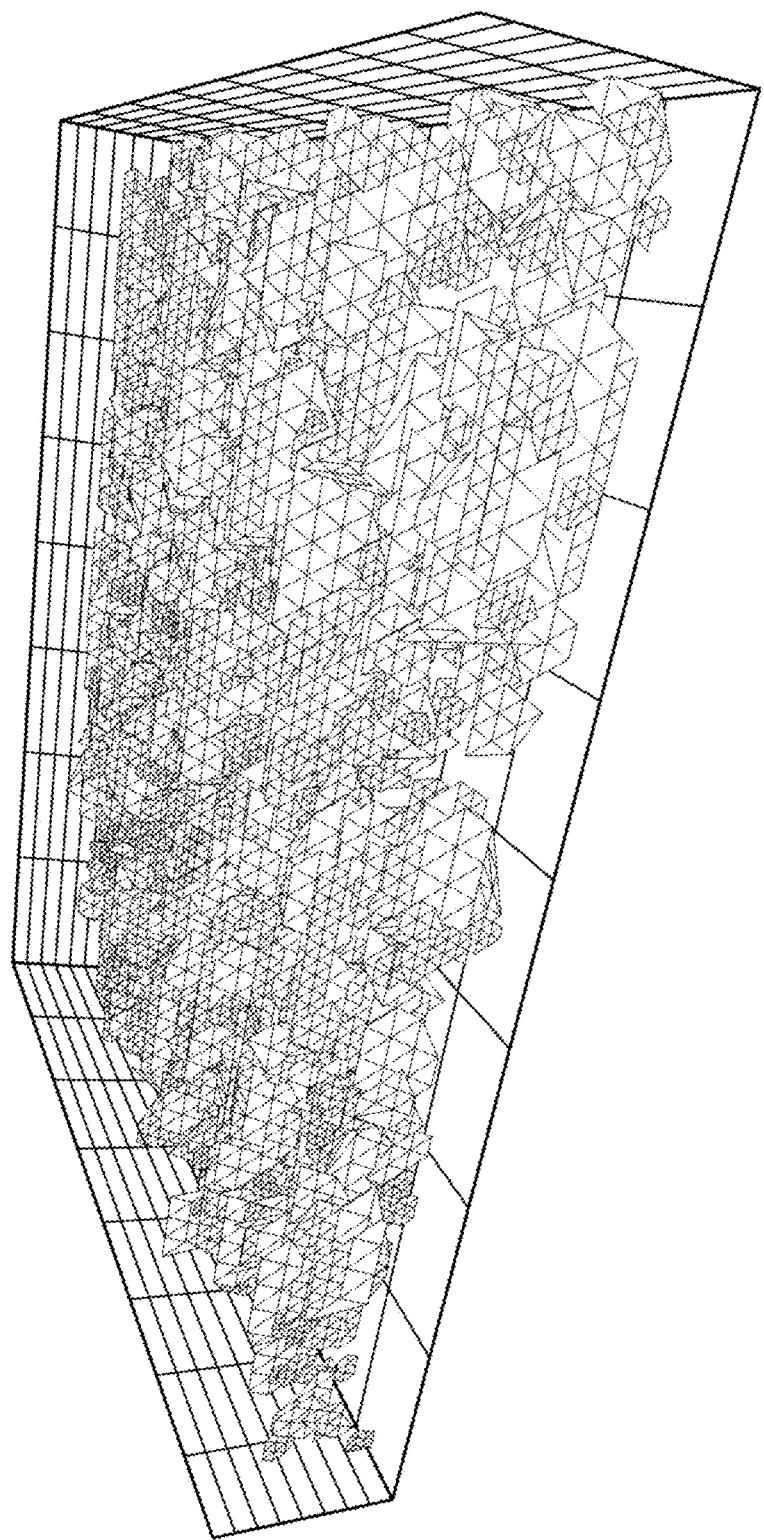
FIG. 2B shows a fracture network simulation using both large and small triangle mesh sizes.

Thereafter, at block 222, fracture network simulation system 100 performs stochastic propagation of the fracture plane using $N_{ORBITS}$ and the $L_{TRI}$ triangle mesh sizes. At block 224, it is then determined whether there are any more fractures to be simulated. If the answer is "Yes," the process stops. However, if the answer is "No," the process reverts back to block 208 whereby the next fracture is selected. This process iterates until all fractures in the fracture network have been simulated. Accordingly, method 200 allows the generation of fracture networks using large and small triangle mesh sizes. In addition to simulating a new fracture network, the disclosed method may also be used to modify an existing simulated network. FIG. 2B shows an illustrative network simulation using both large and small triangle mesh sizes. Thereafter, a fracture operation may be conducted based upon the simulated fracture network.

Figure 3A:
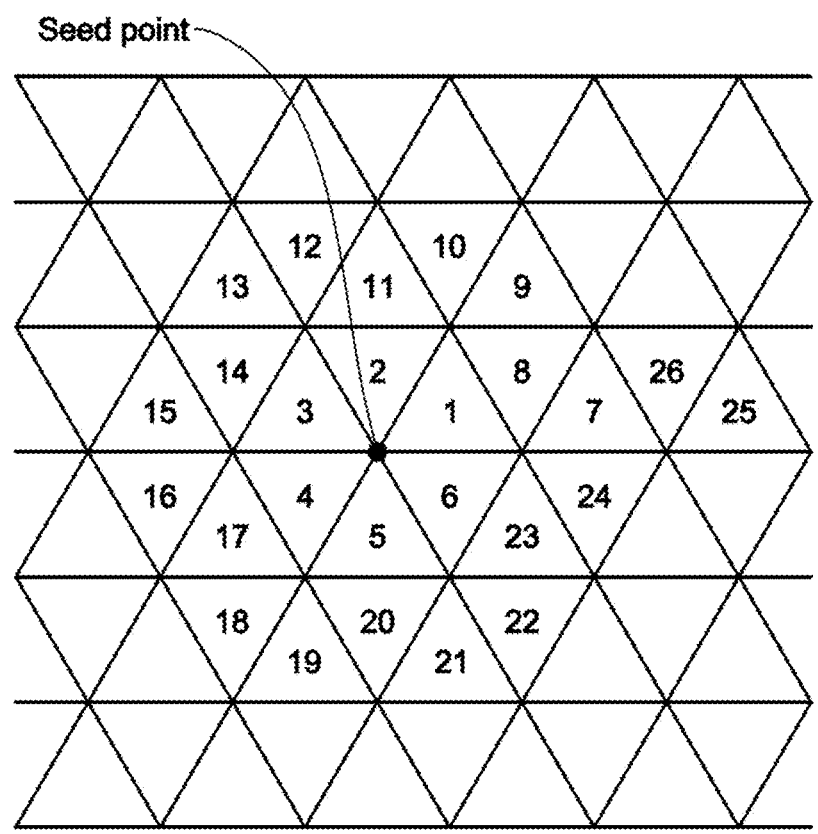
FIG. 3A illustrates a triangle mesh system according to certain illustrative embodiments of the present disclosure.

Now that a generalized method of the present disclosure has been described, a more detailed explanation of the underlying fracture network propagation procedure will now be described. As described above, the basic component of the fracture is a triangle. Triangles are propagated starting from a seed point within the constraint spaces and the generated triangle mesh will represent the fracture shape. FIG. 3A illustrates a triangle mesh system according to certain illustrative embodiments of the present disclosure. In FIG. 3A, the center of the triangular mesh (shown as a black dot) serves as the seed point for the fracture propagation. A triangle order number is assigned to this triangle mesh system. The first six triangles (from triangle number 1 to triangle number 6) will form a hexagonal "orbit," as previously discussed. This hexagonal orbit is defined as the first orbit inside the triangle mesh system. Then, the next hexagonal orbit surrounding orbit one will be defined by triangle number 7 to triangle number 24. This hexagonal orbit is named orbit two. In this way, the orbit number is defined outwardly in the triangle mesh.

To begin the propagation of one natural fracture, the seed point of the fracture is determined. The seed point is the point where the fracture is located inside the constraint volume/area (i.e., simulation). In certain embodiments, the seed point will be selected randomly within the constraint volume, while in other embodiments it will be selected at the location where well fracture pictures ("fracture pics") are located. The well fracture picks are the fractures found along the wellbore. Using well log technology, the wellbore image is obtained. The fracture pictures and information can be found in the wellbore image. The user provides the fracture data, which may be sourced from a variety of means, such as, for example, well log data. The simulated fractures will begin seeding from the fracture pick locations. After all the well fracture pick locations are used, the seeding may begin randomly. In this approach, well data information is honored.

Figure 3B:
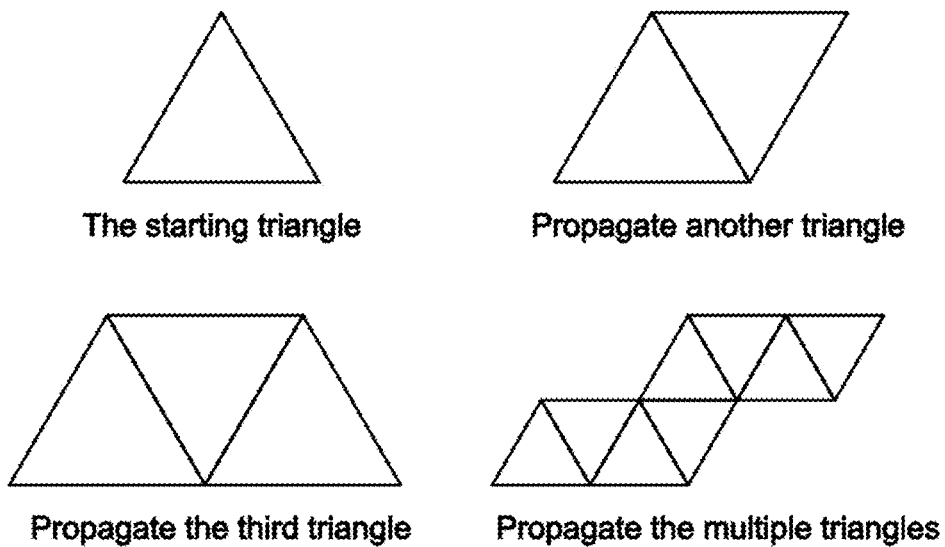
FIG. 3B shows the propagation of multiple triangles, according to certain illustrative methods of the present disclosure.

Next, after locating the first triangle, the triangles next to the existing triangle are then propagated. As the number of triangles grows, the hexagonal orbit number will also grow. FIG. 3B shows the propagation of multiple triangles. As can be seen, the propagation begins with a starting triangle, then another triangle is propagated, then a third and so on.

Figure 3C:
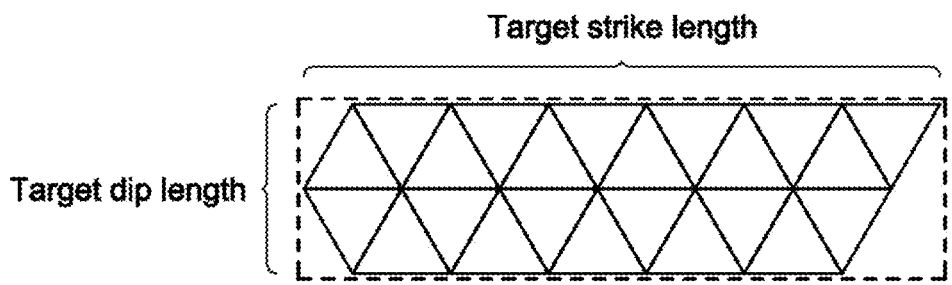
FIG. 3C illustrates the target strike and dip length.

Next, the triangles continue propagating until the entire triangle mesh reaches the target strike length in the strike direction and reaches the target dip length in the dip direction. FIG. 3C illustrates the target strike and dip length. A cumulative length distribution table showing the number of fractures above a given length (with "length" being interpreted as the strike length) is inputted. Based on the cumulative length distribution table, the number of fractures to be simulated and the target strike length of each fracture are known. The distribution table data describing the length/width ratio (with width being interpreted as the dip length and length being interpreted as the strike length) are also required as input data. From the target strike length of each fracture and the random number selected for fracture length/width ratio distribution, the target dip length is determined.

Next, each triangle size inside a fracture is determined. In general, as previously discussed, the maximum of the strike length and dip length (i.e., max length) is equal to Equation 1 and 2 above. An initial estimate for the triangle mesh size is based upon the minimum fracture length $FL_{MIN}$ for the fracture set to which the current fracture belongs. This minimum fracture length is based upon all fractures in the fracture set and should not be confused with the minimum strike and dip lengths. Then, the number of orbits can be calculated based up on the minimum fracture length using Equation 3.

In order to ensure computational efficiency, the illustrative methods described herein intrinsically define a maximum number of orbits ($N_{ORBITS,MAX}$). If the calculated $N_{ORBITS}$ is greater than the maximum number of orbits, the number of orbits is set to the maximum number of orbits. Otherwise, the calculated number of orbits is retained. After calculating the number of orbits, the mesh triangle sizes are calculated using Equation 4.

Next, the preceding propagation steps are repeated to simulate each fracture (i.e., target object). The user defines the number of fractures to be simulated.

Next, the fractures are simulated in a horizontal X-Y plane up to this step. However, the fractures in reality are in 3-D reservoir instead of 2D plane. Thus, each fracture is rotated based on the fracture dip direction and dip angle. For the well fracture pick location, the dip direction and dip angle of the well fracture pick should be available. The dip direction and dip angle of the well pick will be used for each simulated fracture. For randomly picked fracture locations, the user will input dip direction and dip angle distributions of each fracture set to be simulated. Based on the stochastic method, a random number will be obtained from the input distributions and utilized as the dip direction and dip angle of each fracture.

Figure 3D:
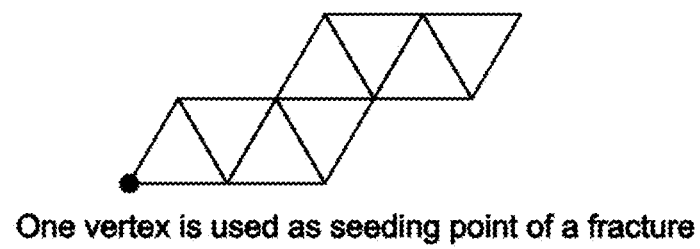
FIG. 3D illustrates how one vertex is used as the seed point of a fracture, according to certain illustrative methods of the present disclosure.

Next, each fracture is composed of triangles and the seed point is only a point. Thus, the process of locating the fracture at the seed point is the process of finding one vertex of one triangle inside the fracture located at the seed point. The vertex of one triangle is randomly selected; however, this selection must meet the following requirements: First, the selection ensures that the fracture surface does not collide with contradictory information (i.e., a section of a wellbore where there are no fractures). Second, the fractures resulting from the selections may or may not be centered on their seed points. FIG. 3D illustrates how one vertex is used as the seed point of the fracture.

Figure 3E:
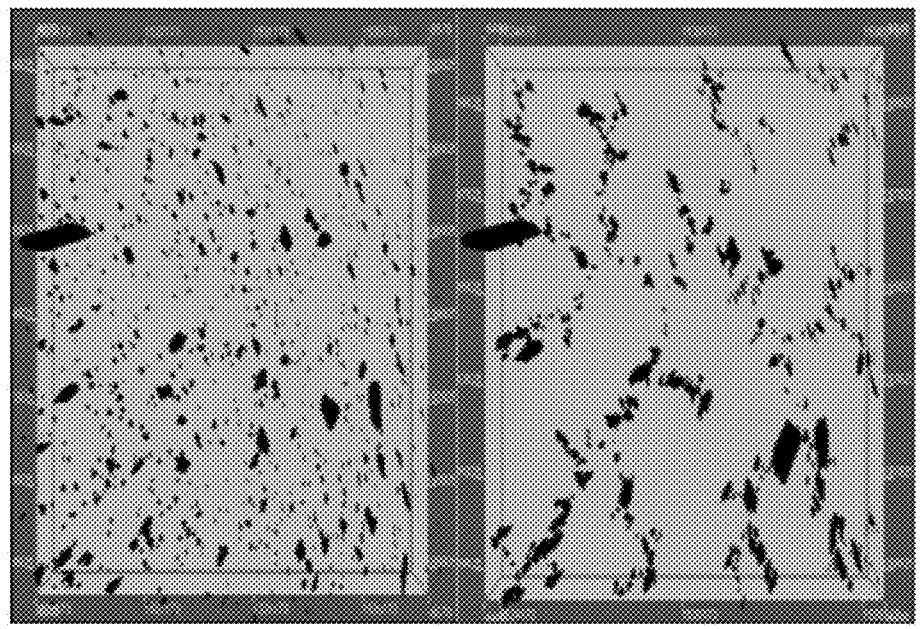
FIG. 3E is a picture of a natural fracture network (view from above) with 0.1 clustering (left) and 0.9 clustering (right), according to certain illustrative methods of the present disclosure.

Next, due to random selection of the seed point of each fracture, the resulting fractures will randomly distribute inside the constraint volume. The user may use a clustering factor to determine the density of fractures. In certain embodiments, the clustering factor ranges from 0 to 1, with 0 meaning "no clustering" (the fractures are just sprinkled randomly, according to a Poisson process) and 1 meaning "strong clustering" (the fractures are all located at the same place). Alternatively, a cluster value of 0.5 or 0.6 may be used to obtain fracture clustering in a realistic way. FIG. 3E is a picture of a natural fracture network (view from above) with 0.1 clustering (left) and 0.9 clustering (right). It can be seen how alteration of the cluster factor results in different simulation results.

Secondary data may also be used to control the location of seed points. Here, permeability, porosity or other properties (i.e., secondary data) are obtained from seismic surveys. This data may then be input into the system and utilized as secondary data. The secondary data helps to control where fractures should be simulated (e.g., more fractures in this area, less in this area). The user can then select direct or inverse correlation to thereby relate the secondary data to fracture density. Direct correlation will cause the fractures to (mostly) be near locations where the secondary data values are highest. Inverse correlation will cause the fractures to mostly be near locations where the secondary data values are lowest.

In view of the foregoing discussed in relation to FIGS. 3A-3E, FIG. 3I is a flow chart of a corresponding method for simulating a target object according to certain illustrative methods of the present disclosure. In method 300A, first, the system determines a seed point for the target object within the constraint volume at block 302A. As previously discussed, the seed point may represent a vertex of a first triangle forming part of the target object. At block 304A, one or more hexagonal orbits of triangles adjacent the first triangle are propagated, thereby forming the target object. At block 306A, the system then determines the size of each triangle based upon the dimensions of the target object, as described herein. Then, at block 308A, the system generates the target object.

Figure 3F:
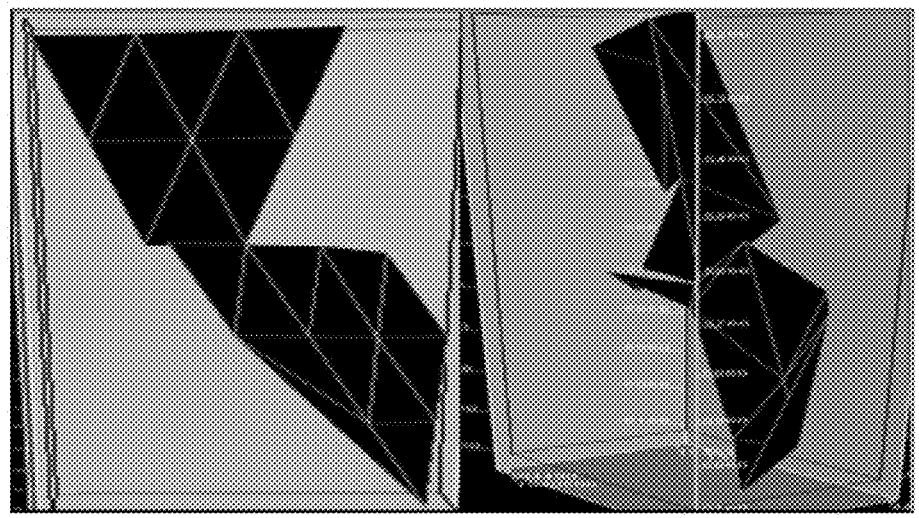
FIG. 3F illustrates two fractures with the same parameters, except smoothness, according to certain illustrative methods of the present disclosure.

Next, in certain alternative methods of the present disclosure, a Z value of the fracture surface may be created to form an undulating, or wave-like, surface. The Z direction is in the direction perpendicular to the X-Y plane of the fracture. The user will provide a smoothness factor to determine how smooth the fracture surfaces will be. In certain embodiments, the smoothness factor ranges from 0 to 1, with 1 meaning a 2D planar surface and 0 meaning quite bumpy surface with large spikes in Z values along the surface. FIG. 3F illustrates two fractures with the same parameters, except smoothness, according to certain illustrative embodiments of the present disclosure. In FIG. 3F, the smoothness of the left-side fracture is 0.9, and the smoothness of the right-side fracture is 0.1. As you can see, the fracture to the right is the smoother of both.

Figure 3G:
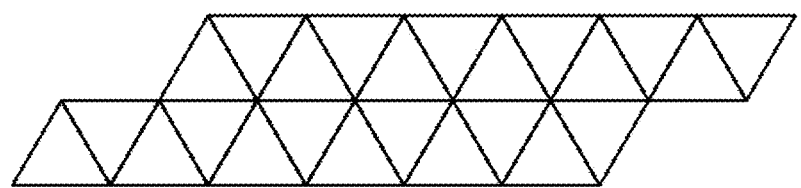
FIG. 3G illustrates triangles and vertexes that form one illustrative fracture surface.
Figure 3H:
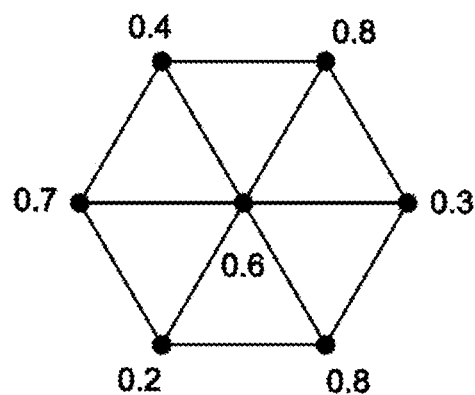
FIG. 3H illustrates how the normally distributed value may be assigned to each vertex of one hexagonal section inside a fracture surface, according to certain illustrative methods of the present disclosure.
Figure 3I:
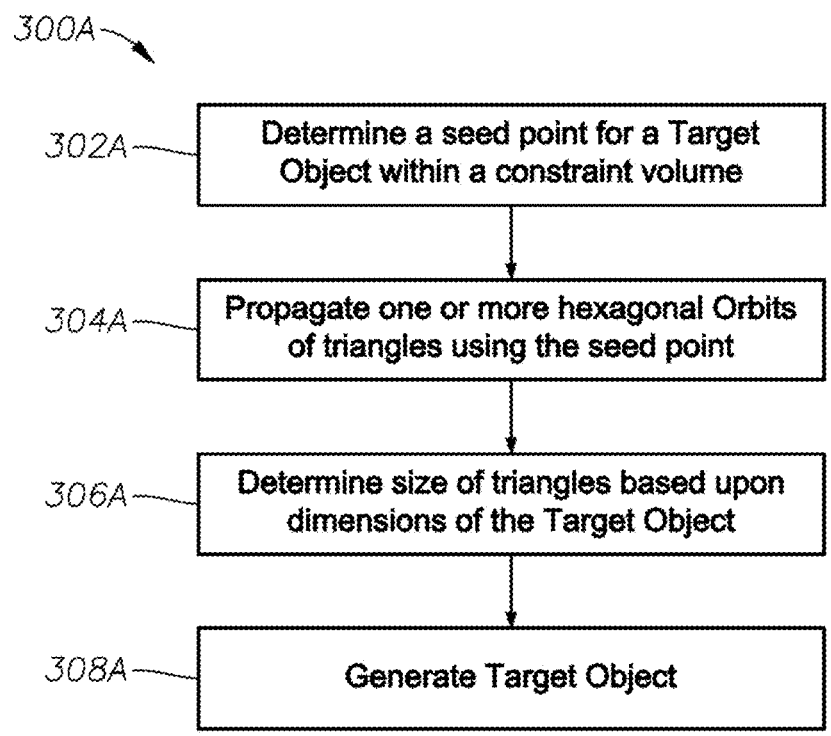
FIGS. 3I and 3J are alternate methods of simulating target objects, according to certain illustrative methods of the present disclosure.
Figure 3J:
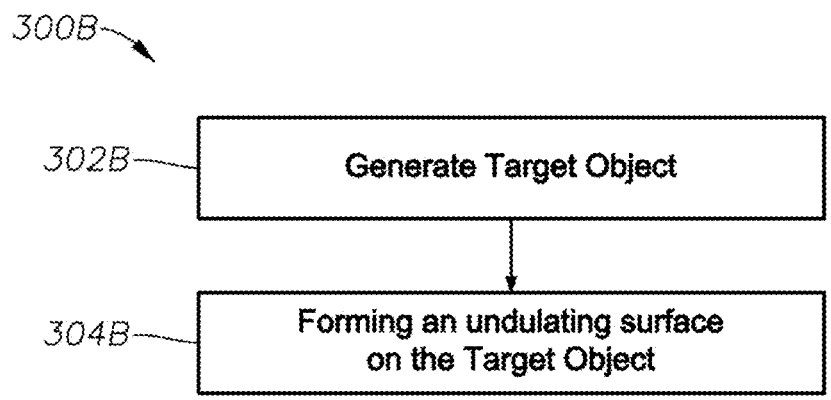

The method necessary to calculate the Z value will now be described. First, the system generates a list of vertexes that will need Z values. The generated vertexes are the ones that belong to the triangles that were aggregated to form the fracture surface area. FIG. 3G illustrates triangles and vertexes that form one illustrative fracture surface. Second, normally distributed white noise is assigned to each vertex. FIG. 3H illustrates how the normally distributed value may be assigned to each vertex of one hexagonal section inside a fracture surface. The normally distributed value at each vertex point will be the initial Z value.

Third, each vertex is locally smoothed, meaning that the average value of the nearest neighbors are used as the new Z value at this vertex. For FIG. 3H, the new value of the center vertex will be the average value of the six neighbors. This procedure is iteratively performed for each vertex of the fracture surface (the iteration number is based on the smoothness factor and the maximum fracture length $FL_{MAX}$). The maximum length of each fracture (either the strike length or the dip length) is divided by the triangle side, which gives the maximum number of iteration. The iteration number is given by the maximum number of iteration multiplied by the smoothness factor. The equations are shown below:

$$FL_{MAX} = \frac{\max(\text{strike length, dip length})}{\text{Triangle side}}. \quad \text{Eq.(5)}$$

$$\text{Iteration number} = \frac{FL_{MAX}}{\text{Triangle side}} \times (\text{smoothness factor}) \quad \text{Eq.(6)}$$

After the local smoothing procedure, the simulated Z values are obtained at each vertex location.

The next step is to normalize the simulated Z values so that they have a standard normal distribution.

$$Z_{Normalized} = \text{Normalize}(Z_{simulated}) \quad \text{Eq. (7),}$$

The final step of creating Z values is to set the standard deviation of the Z values to the appropriate level. This will depend on the maximum length of the fracture. The average of the dip direction standard deviation and standard dip angle deviation provided by the user is used to define the average level of fluctuation one may expect to see. The value of smoothness factor provided by the user is used to dampen the total magnitude of the fluctuations on the undulating fracture surface. In the following equation:

$$Z_{SDV} = \frac{\text{Dip direction} + \text{Dip angle}}{2}, \quad \text{Eq.(8)}$$

the average value of Z ($Z_{SDV}$) of the dip direction standard deviation and standard dip angle deviation is obtained. Then, in the next equation:

$$Z_{MAX} = FL_{MAX} \times \tan(Z_{SDV}) \quad \text{Eq. (9),}$$

the maximum length of the fracture is multiplied by $Z_{SDV}$ to generate a $Z_{MAX}$ value. In Equation 9, the smoothness value is used to dampen the max value in Z direction. Therefore, the final value in the Z direction for each vertex point is obtained using:

$$Z_{Final} = \frac{FL_{max}}{2} \times (1 - \text{smoothness factor}). \quad \text{Eq.(10)}$$

In view of the foregoing and FIGS. 3F-3H, FIG. 3J is a flow chart of a corresponding method for simulating a target object having an undulating surface, according to certain illustrative methods of the present disclosure. Referring to method 300B, at block 302B, the system first generates the target object using any of the methods described herein. At block 304B, using the technique described above, the system then forms the undulating surface on the target object using the Z value.

In view of the foregoing, various illustrative implementations of the present disclosure will now be described. FIGS. 4A-4M are screen shots of user interfaces useful to illustrate a method by which a fracture network is bounded by surfaces, according to certain illustrative methods of the present disclosure. For generating natural fracture networks in a region bounded by surfaces, a set of surfaces defining upper and lower boundaries of the region are defined. In certain embodiments, the network can be generated with (conditional simulation) or without (unconditional simulation) information regarding the fracture picks located at the wells inside the bounded region. An illustrative method for generating natural fracture networks with fracture pick information will now be described.

Figure 4A:
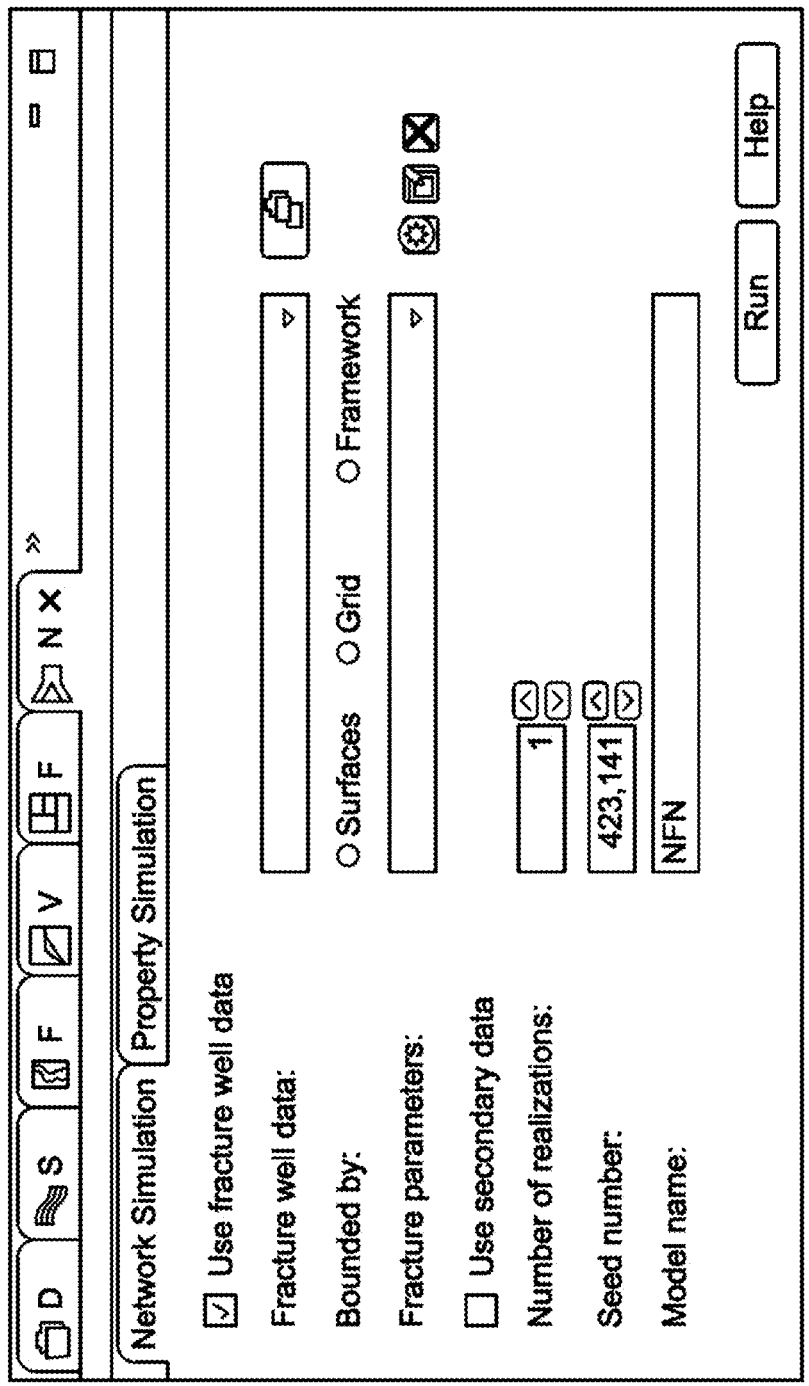
FIGS. 4A-4M are screen shots of user interfaces useful to illustrate a method by which a fracture network is bounded by surfaces, according to certain illustrative methods of the present disclosure.
Figure 4B:
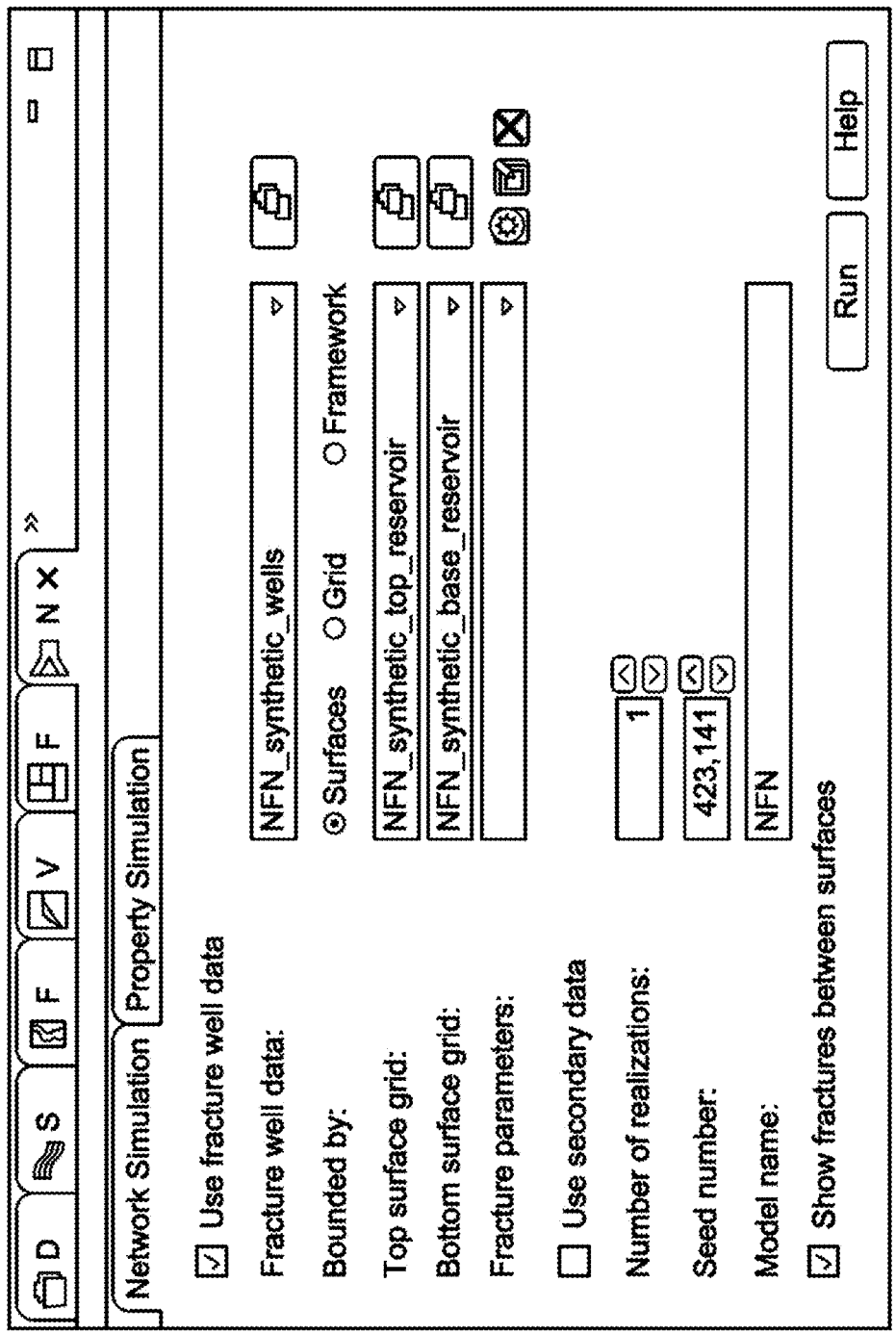

With reference to FIG. 4A, the natural fracture network simulation platform has been launched. As can be seen, there are options to input various data parameters defining the fracture network. These include, for example, the boundaries, number of realizations (number of simulation user would like to run), and seed point numbers. FIG. 4B shows that, in this example, the fracture well data "NFN_synthetic_wells" has been loaded, and surfaces boundaries has been selected. The top and bottom surface grid boundaries have been defined as "NFN_synthetic_top_reservoir" and NFN_synthetic_base_reservoir." The number of realizations has been set to 1, and the seed number to 423,141. In addition, showing the fractures between the surfaces has been selected.

Figure 4C:
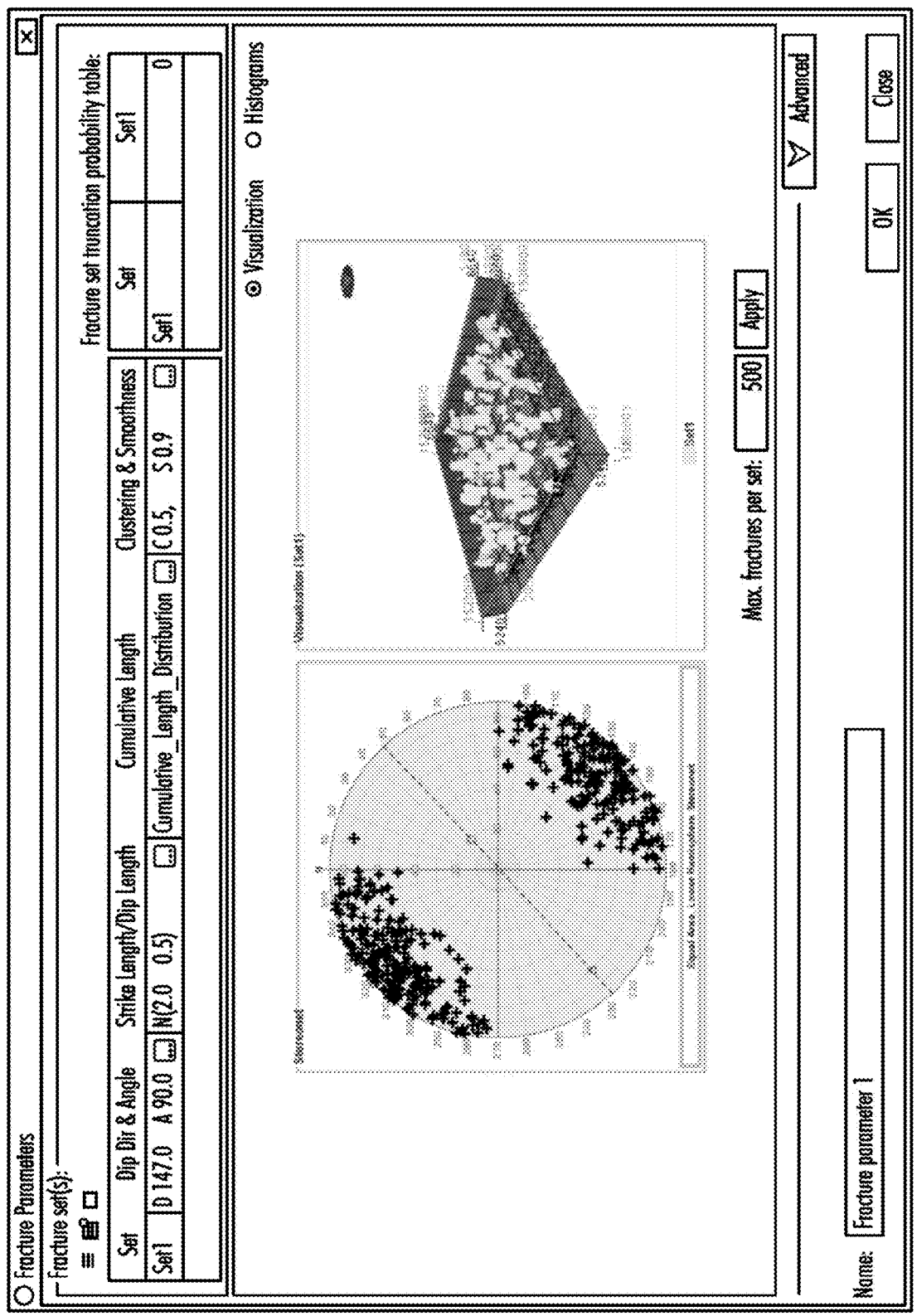
Figure 4D:
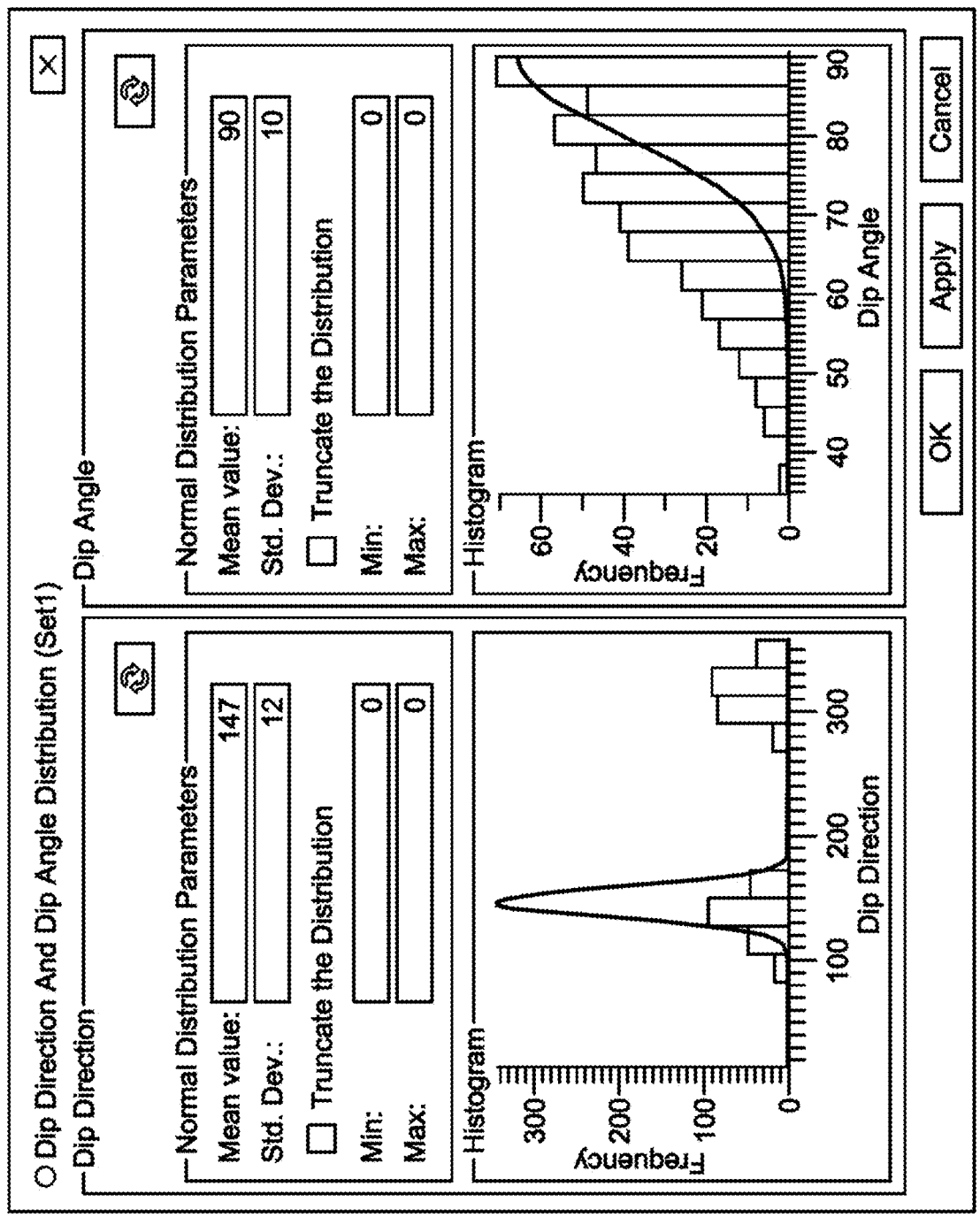
Figure 4E:
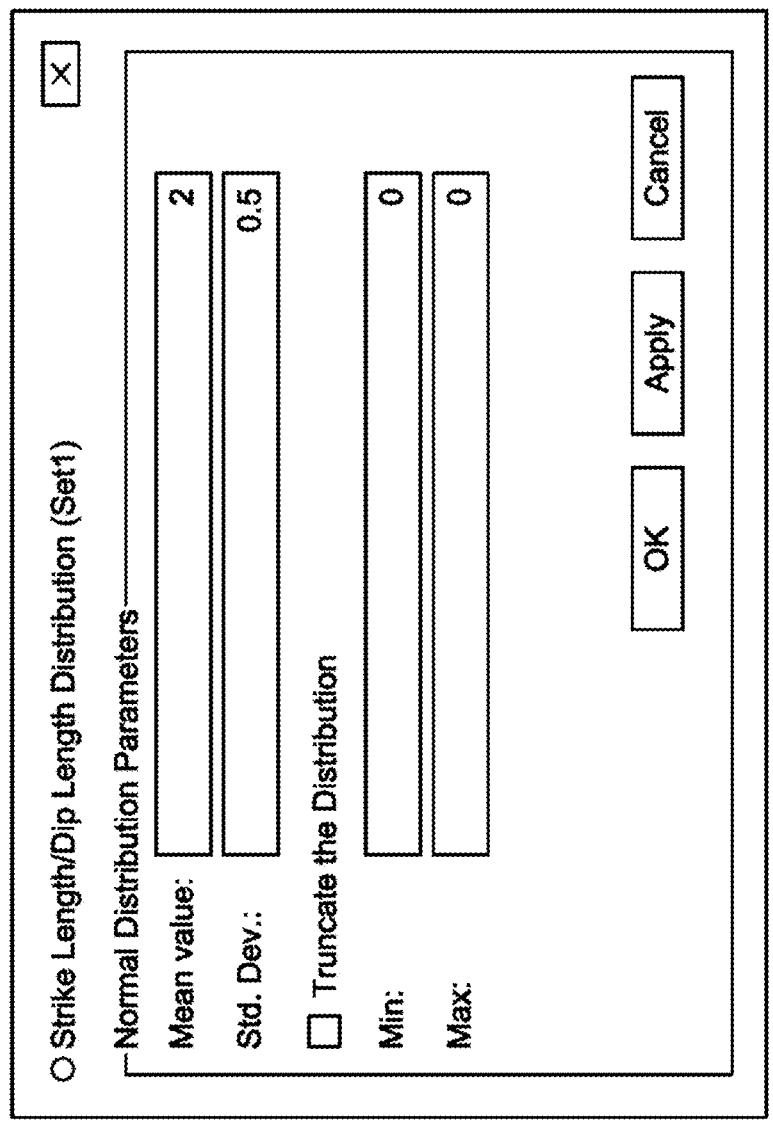

In FIG. 4C, fracture parameters which define the orientation and size of the fractures in the fracture sets are entered. The dip direction and angle, strike and dip lengths, cumulative length and clustering and smoothness are all defined here. The cumulative length distribution defines the total number of fractures in the fracture sets, and their lengths. The stereonet and visualization are used to show the direction of the fractures so that different fracture sets can be determined. Toward the bottom of the interface of FIG. 4C, the maximum number of fractures in the set are defined. FIG. 4D shows how the values for dip direction (azimuth) and dip angle of the fractures may be defined for a given fracture set, along with a histogram for both. FIG. 4E shows how the strike to dip length distribution ratio is defined.

Figure 4F:
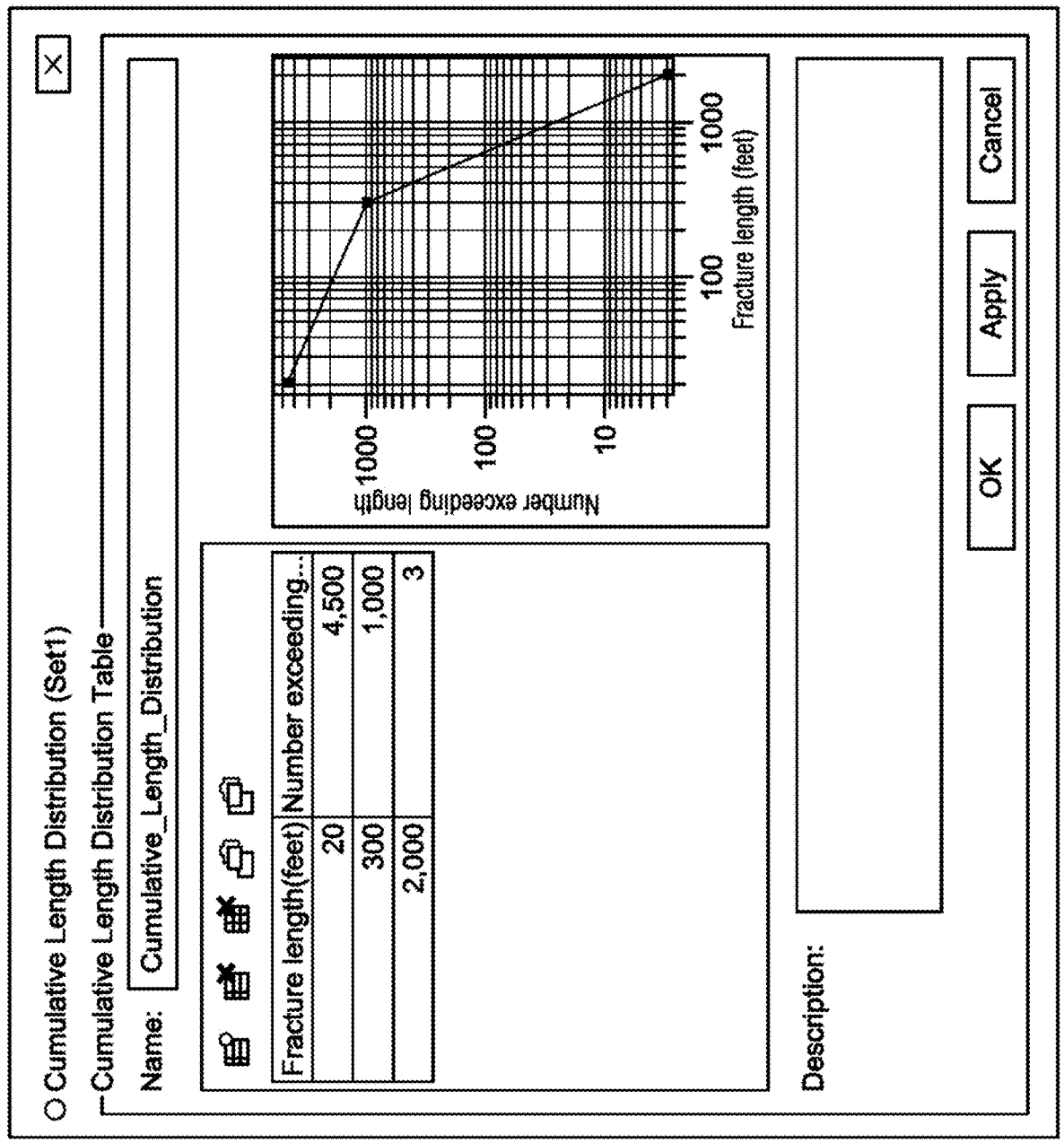
Figure 4G:
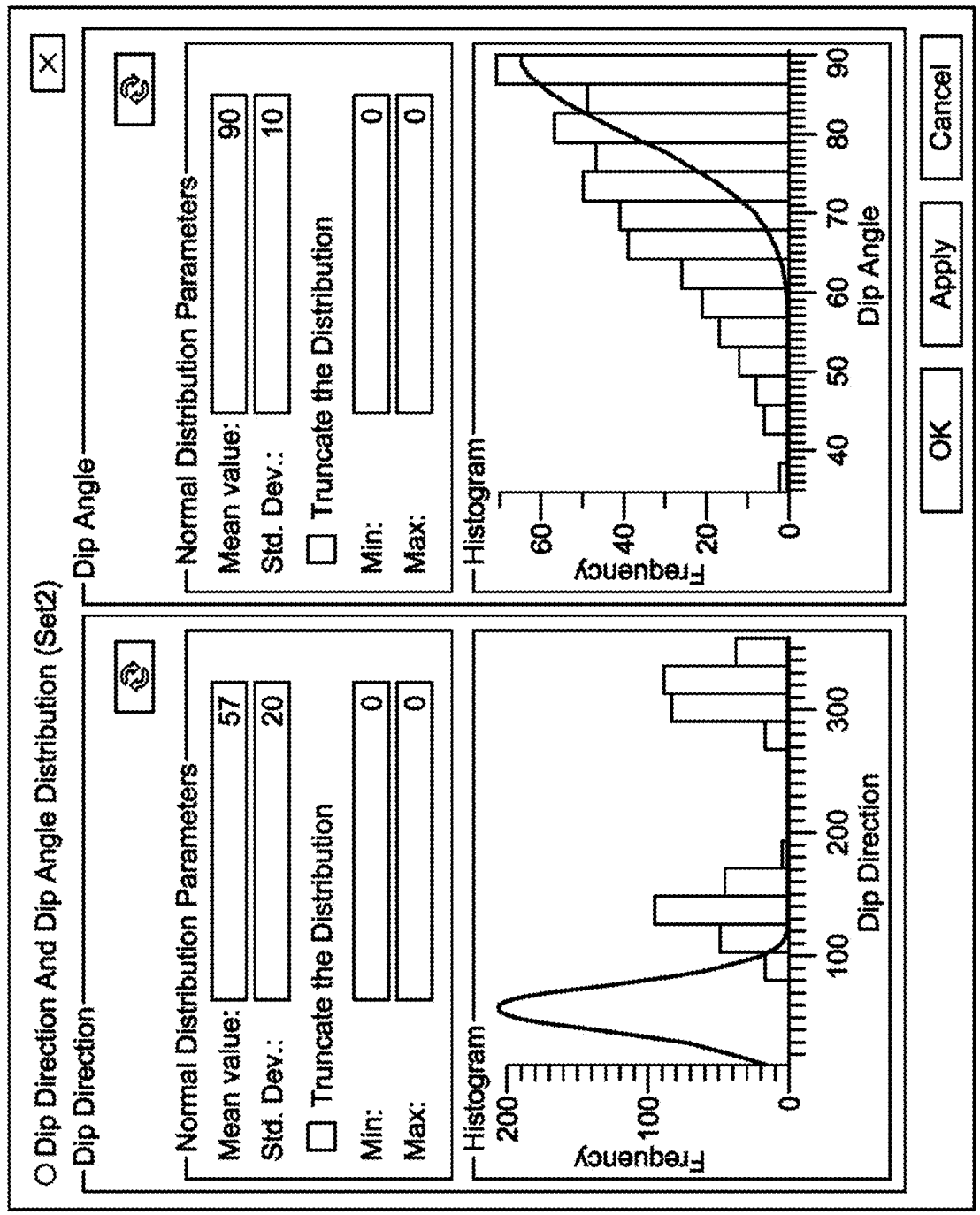
Figure 4H:
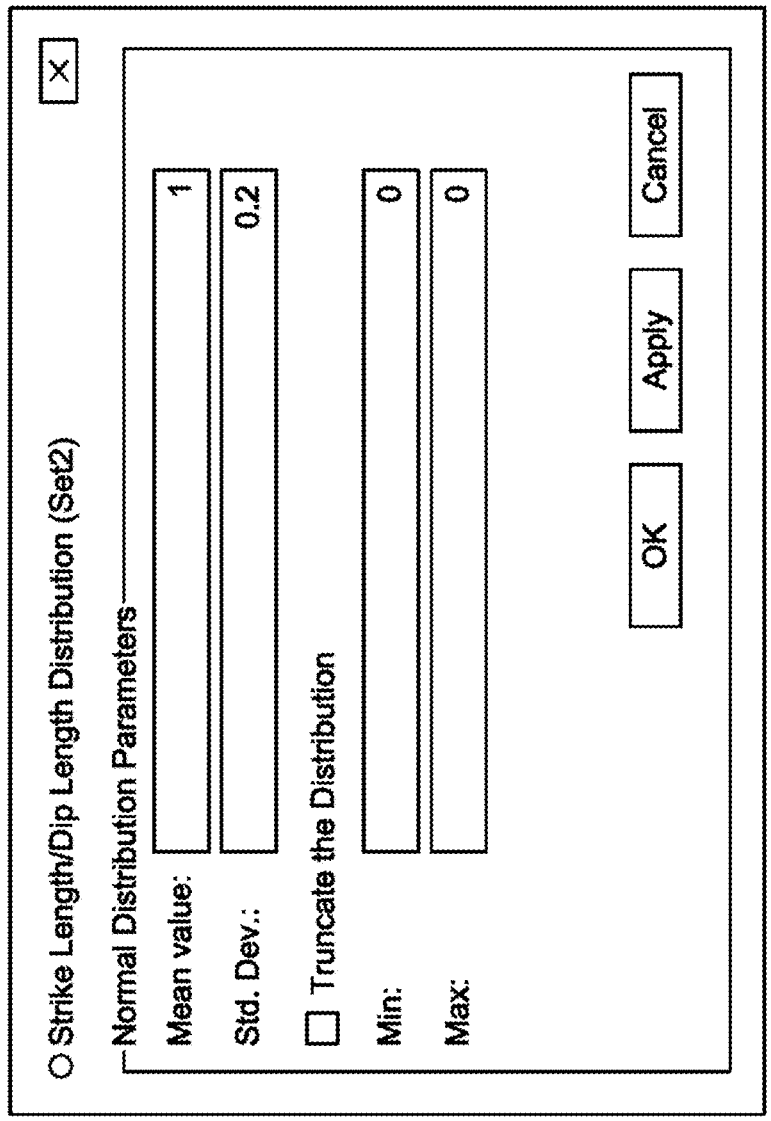
Figure 4I:
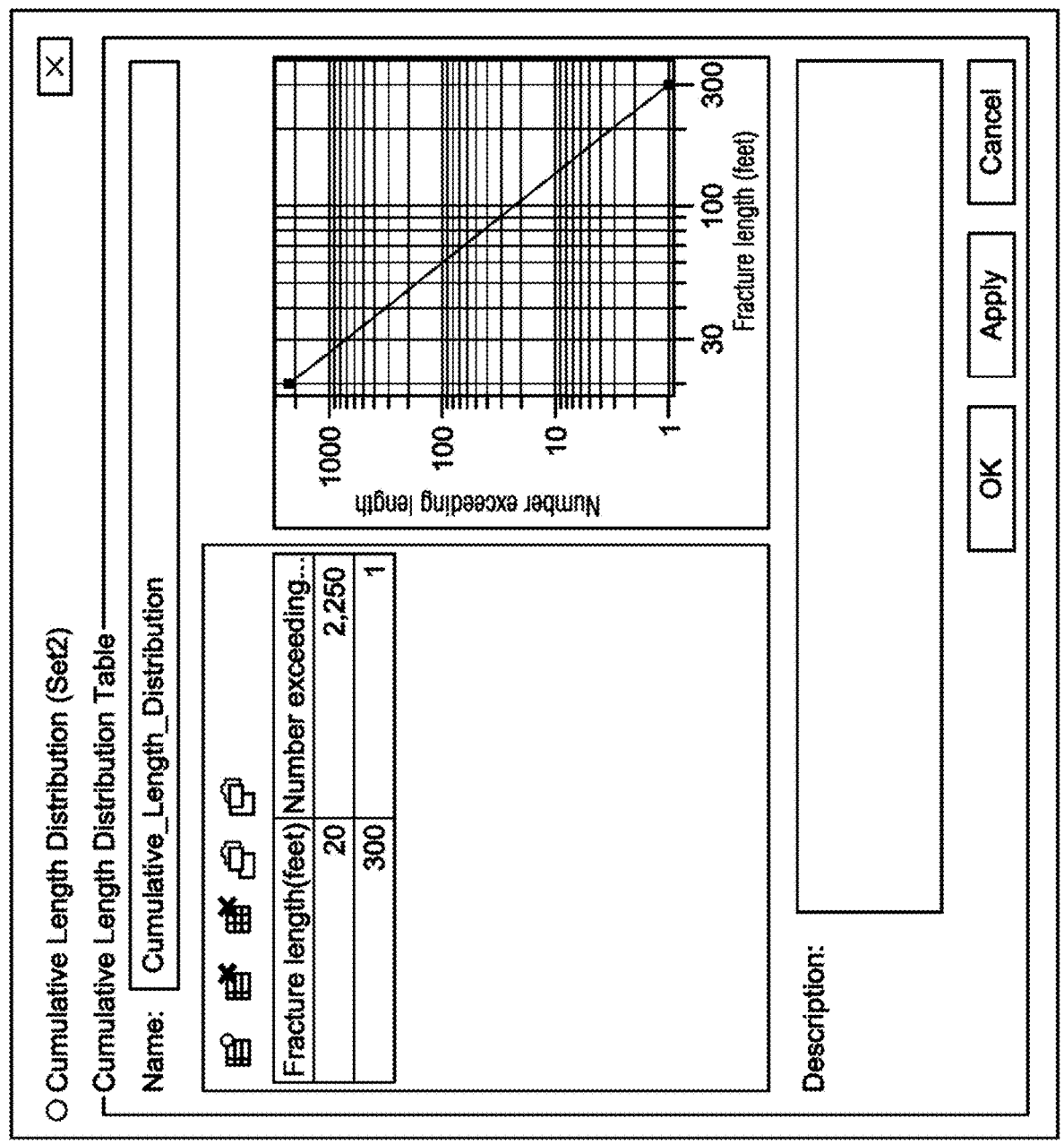

FIG. 4F shows how the cumulative length distribution defines the total number of fractures in the fracture sets, and the number exceeding certain lengths. In the illustrated example, there are 4500 fractures with fracture lengths greater than 20 FT; there are 1000 fractures with fracture lengths greater than 300 FT; and there are 3 fractures with fracture lengths greater than 2000 FT. After entering the parameters in this fracture set, a visual validator panel (marked with a heading "Visualization") appears in the panel. The display in the visual validator provides information about the way fractures will be generated following the parameters in this fracture set. In FIG. 4G, another fracture set is being created, after the creation of the initial fracture set, whereby the dip direction and angle are entered again, the strike and dip lengths for the second fracture set are entered in FIG. 4H; and the cumulative length distribution for the second set are entered in FIG. 4I.

Figure 4J:
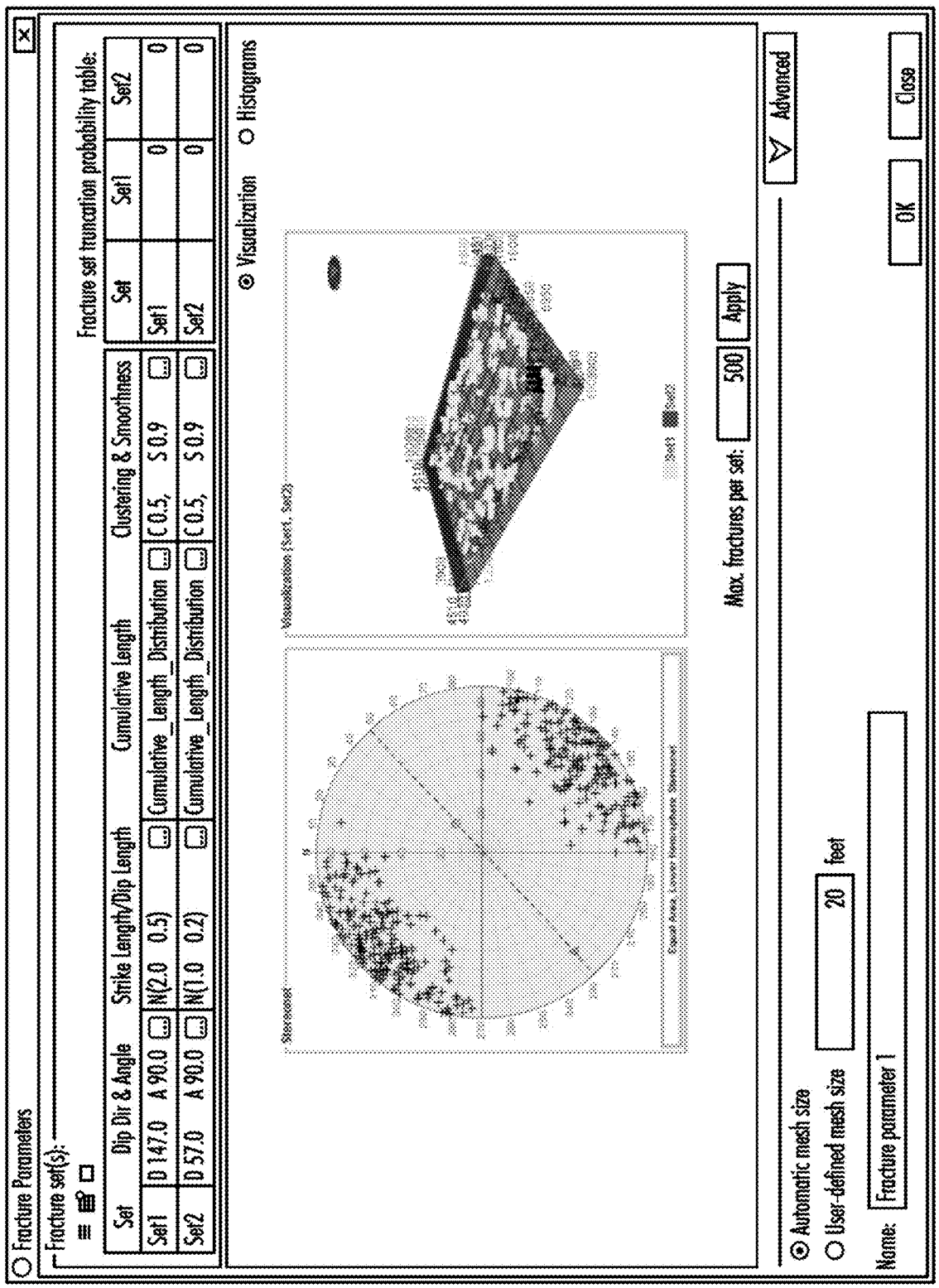

FIG. 4J shows how the fracture parameters are defined. In this illustrative embodiment, up to 5 fracture sets may be defined; however, in others, more or less sets may be defined. Nevertheless, upon expanding the advanced options tab in the Fracture Parameters panel of FIG. 4J, the triangular mesh size may be automatically calculated or a custom user-defined value may be entered, whereby the different size triangles of the fracture simulation are determined.

Figure 4K:
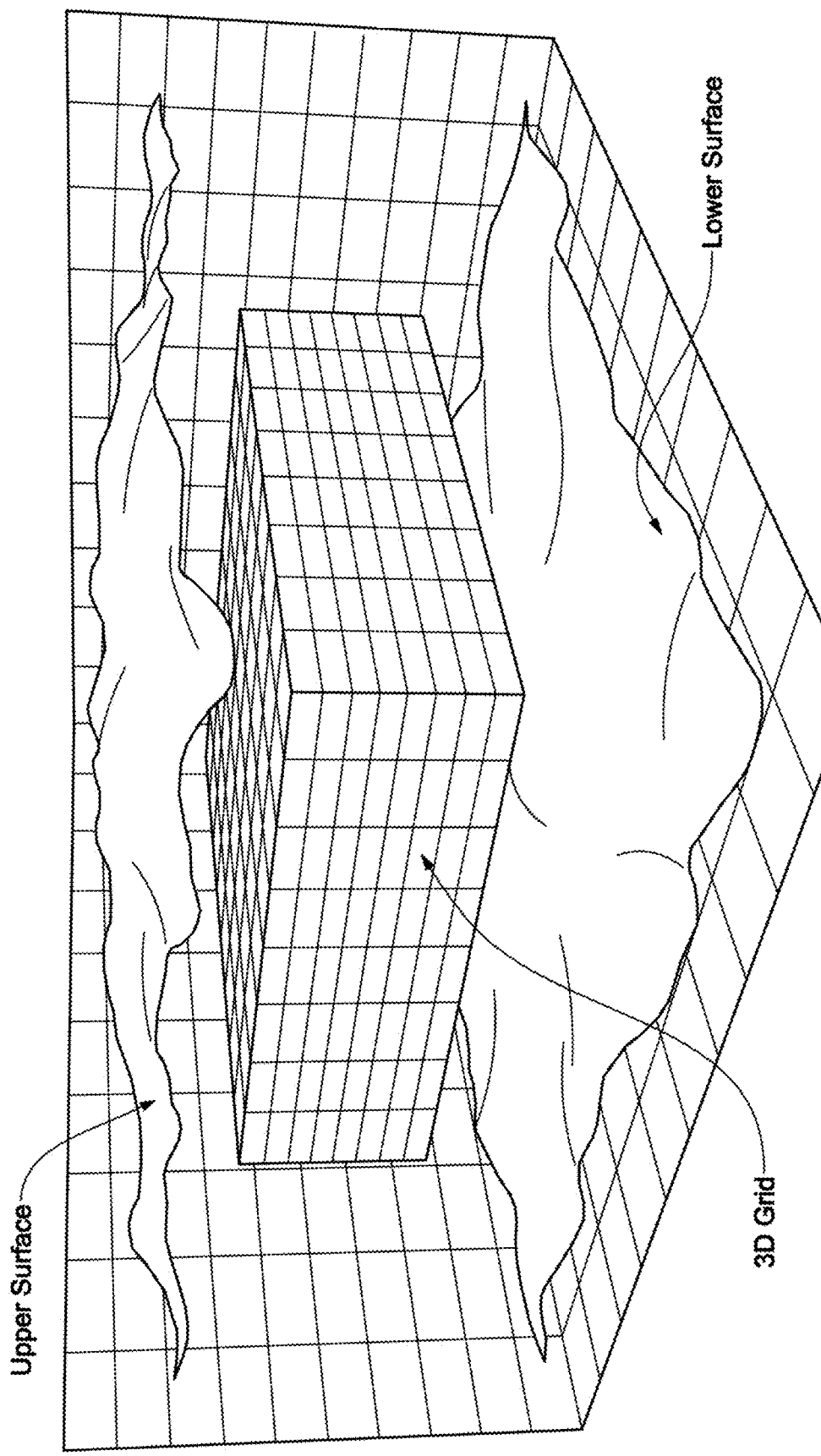

FIG. 4K shows how secondary data may be defined in the fracture network. After defining the fracture sets, secondary data may be defined which controls the location of the fracture seed points in the region bounded by the upper and lower surfaces. The secondary data is located on the 3D grid that coincides with the region bounded by the surfaces. The secondary data may be, for example, seismic attributes which show were fractures can exist, curvature maps, etc. The secondary data helps to control where fractures should be simulated (e.g., more fractures in this area, less in this area).

Figure 4L:
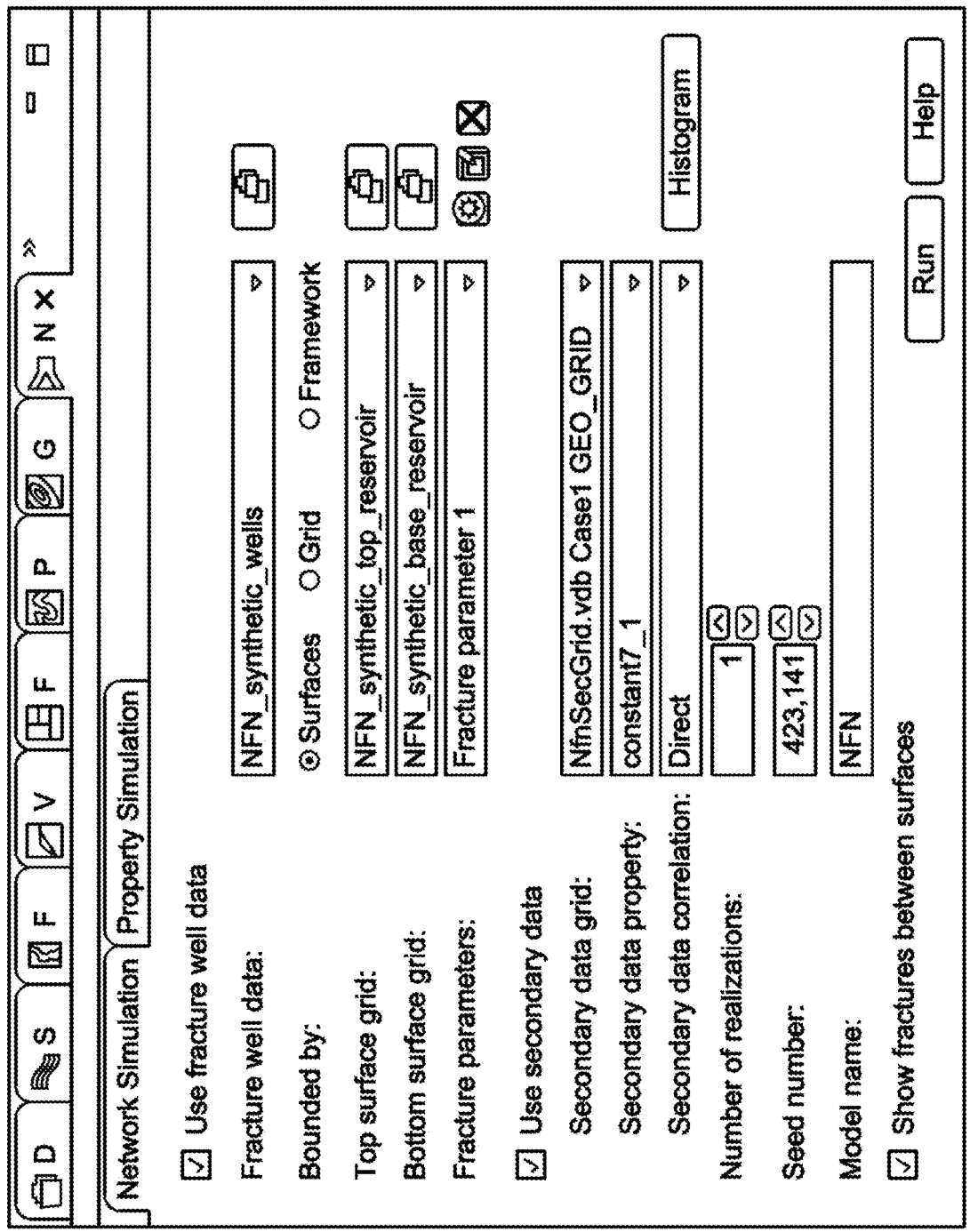
Figure 4M:
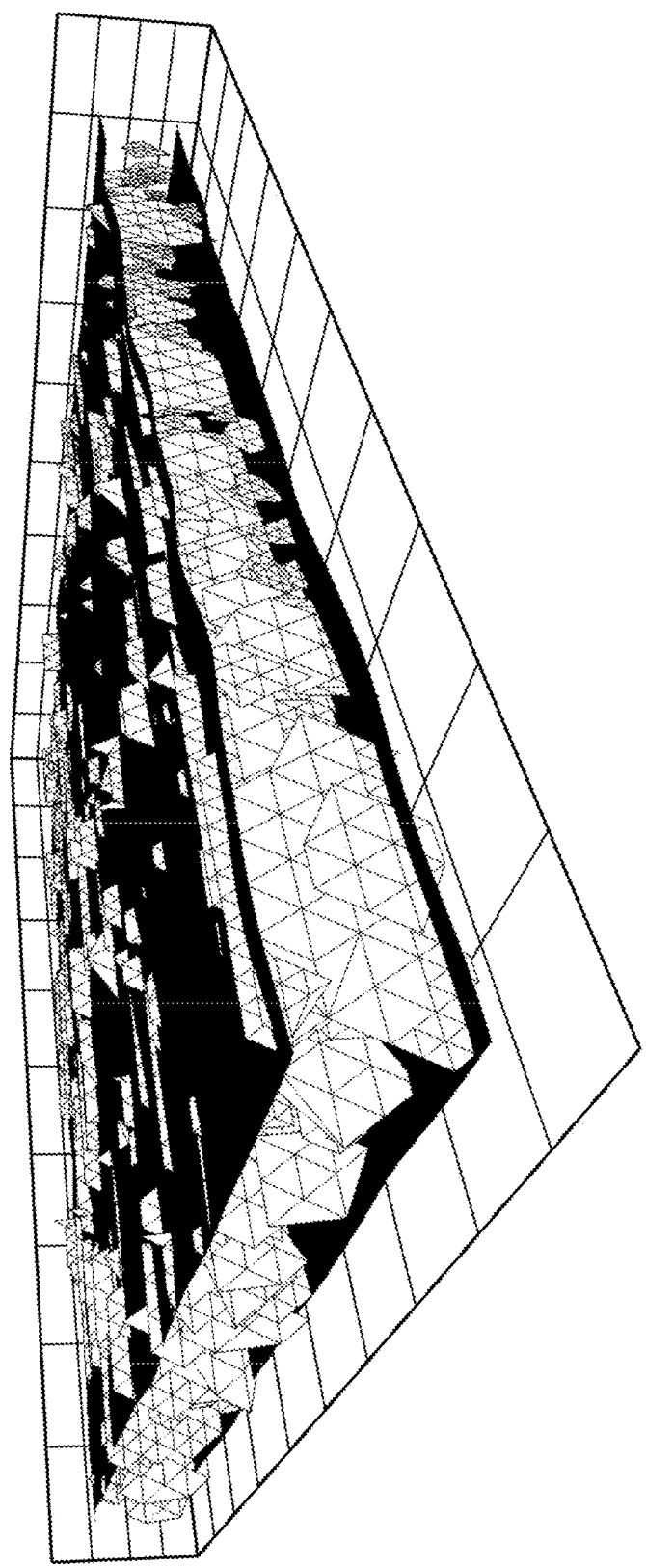

After selecting the appropriate property in the 3D grid, and it's correlation with the presence of fractures at that location (direct or inverse), a model name is provided for this fracture network, as shown in FIG. 4L (model name "NFN"). Now that all required input parameters have been entered, the simulation can be run. Once the network simulation is completed successfully, the generated fracture network can be visualized in the cube view, as shown in FIG. 4M, whereby the fractures are simulated using large and smaller triangle mesh sizes.

Figure 5A:
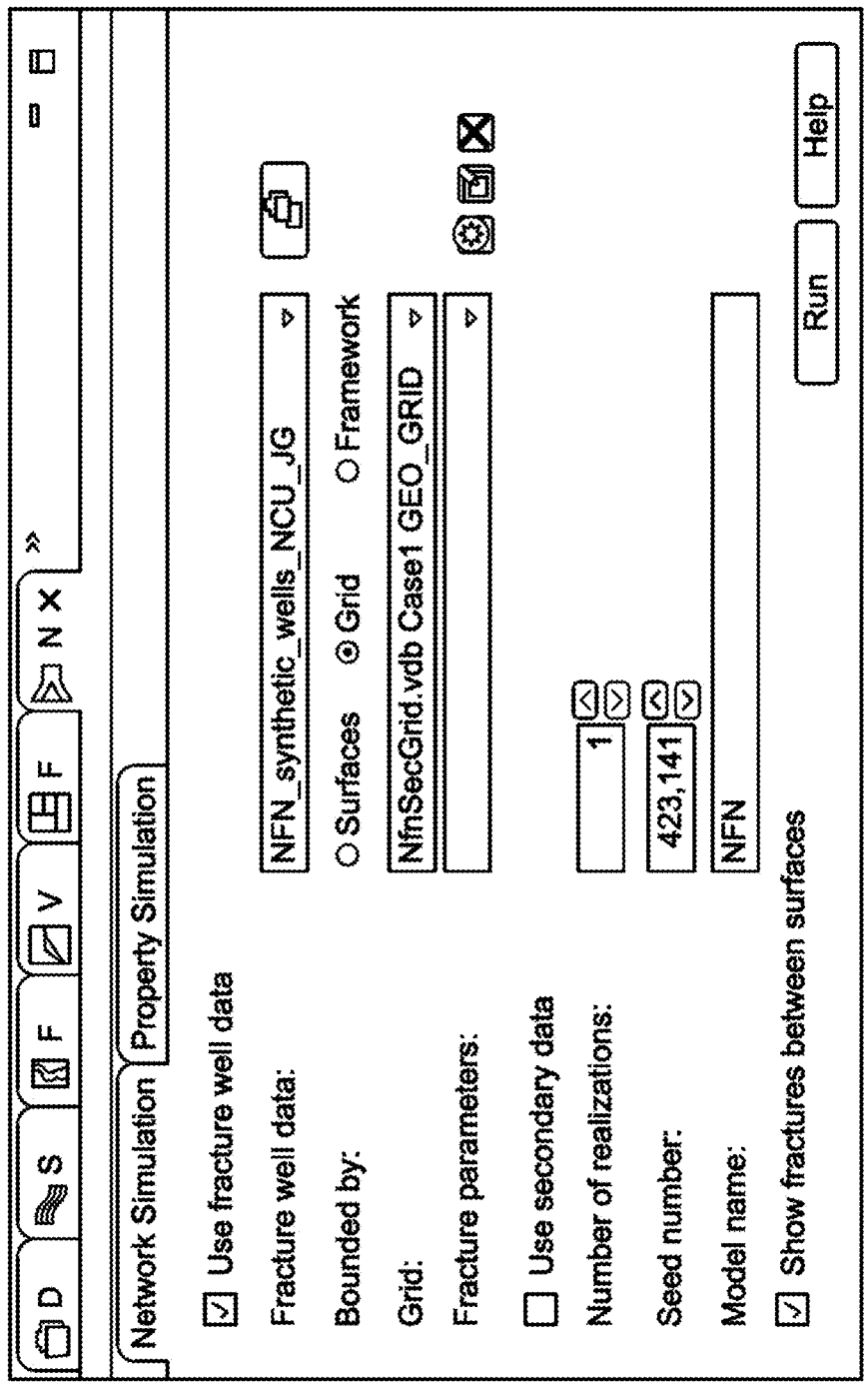
FIGS. 5A-5D are screen shots of user interfaces useful to illustrate a method by which a fracture network is bounded by a 3D grid, according to certain illustrative methods of the present disclosure.
Figure 5B:
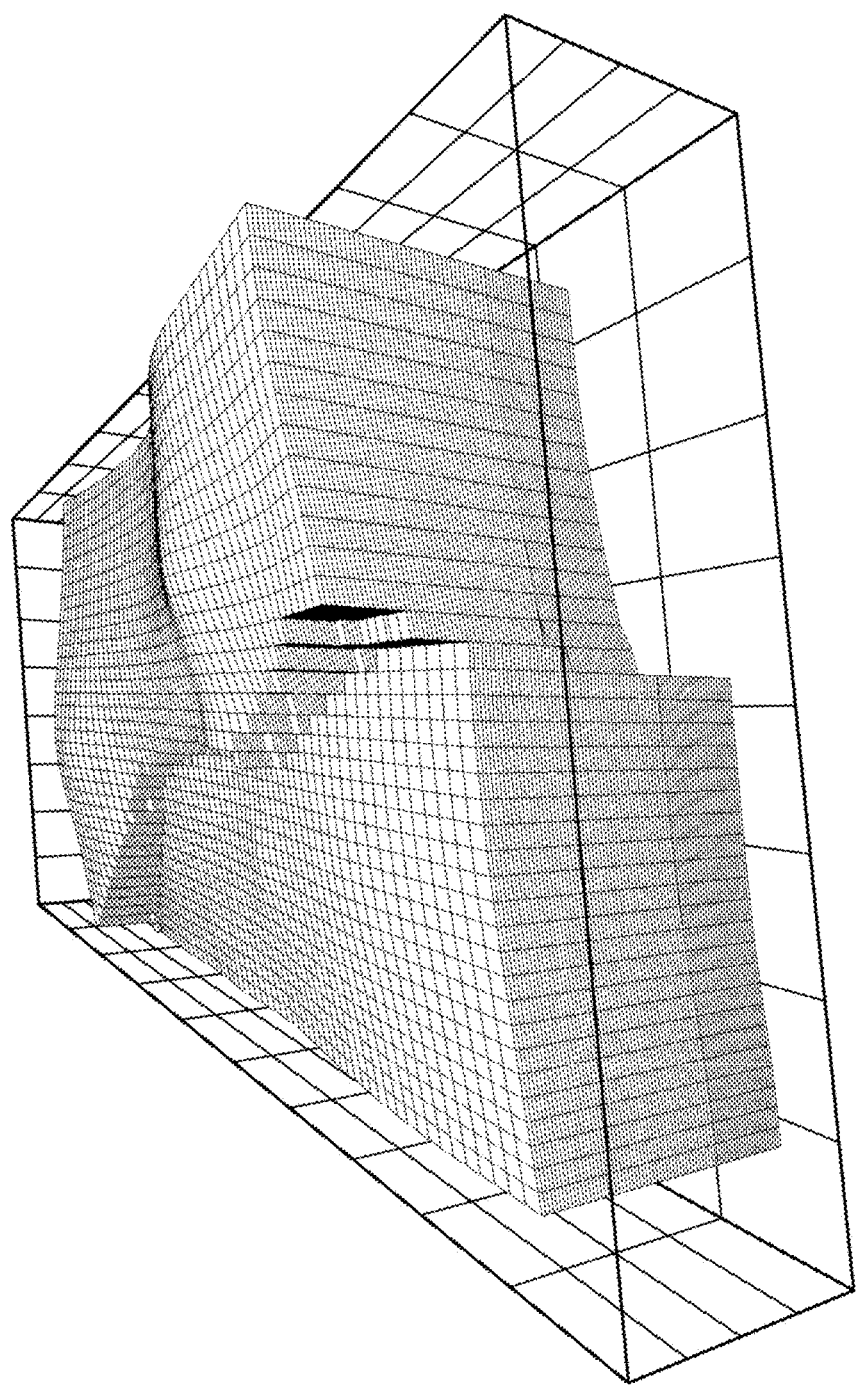

FIGS. 5A-5D are screen shots of user interfaces useful to illustrate a method by which a fracture network is bounded by a 3D grid, according to certain illustrative methods of the present disclosure. Embodiments of the present disclosure also support both regular and stratigraphic grids for generating fracture networks. The following example outlines the method followed in generating fracture network inside a 3D stratigraphic grid. In FIG. 5A, the "Grid" option is selected, and the 3D stratigraphic (or regular) grid is loaded into the system. In addition, the appropriate fracture well data for the chosen grid is also selected. FIG. 5B illustrates the fracture network region bounded by a 3D grid for illustrative purposes.

Figure 5C:
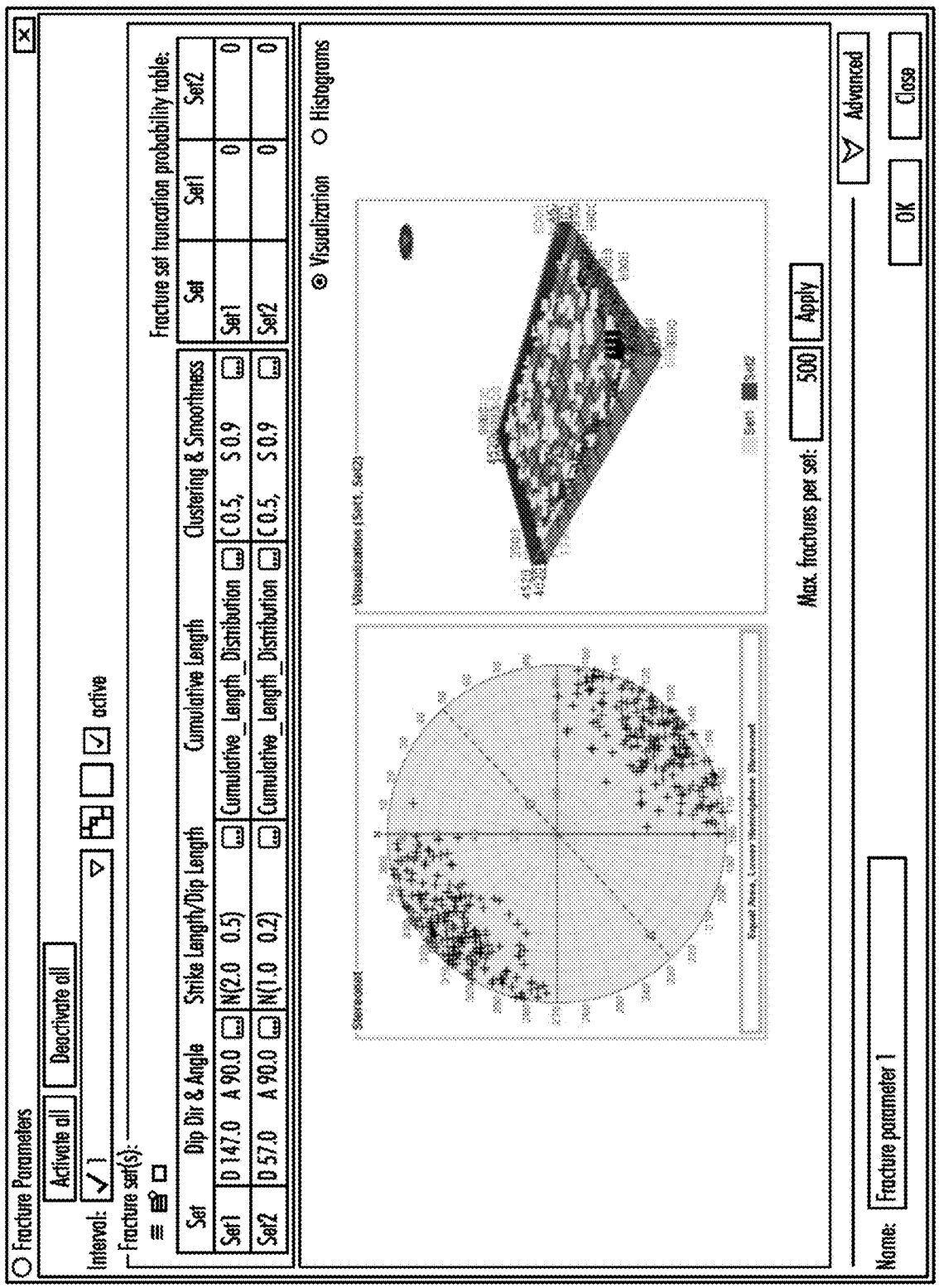
Figure 5D:
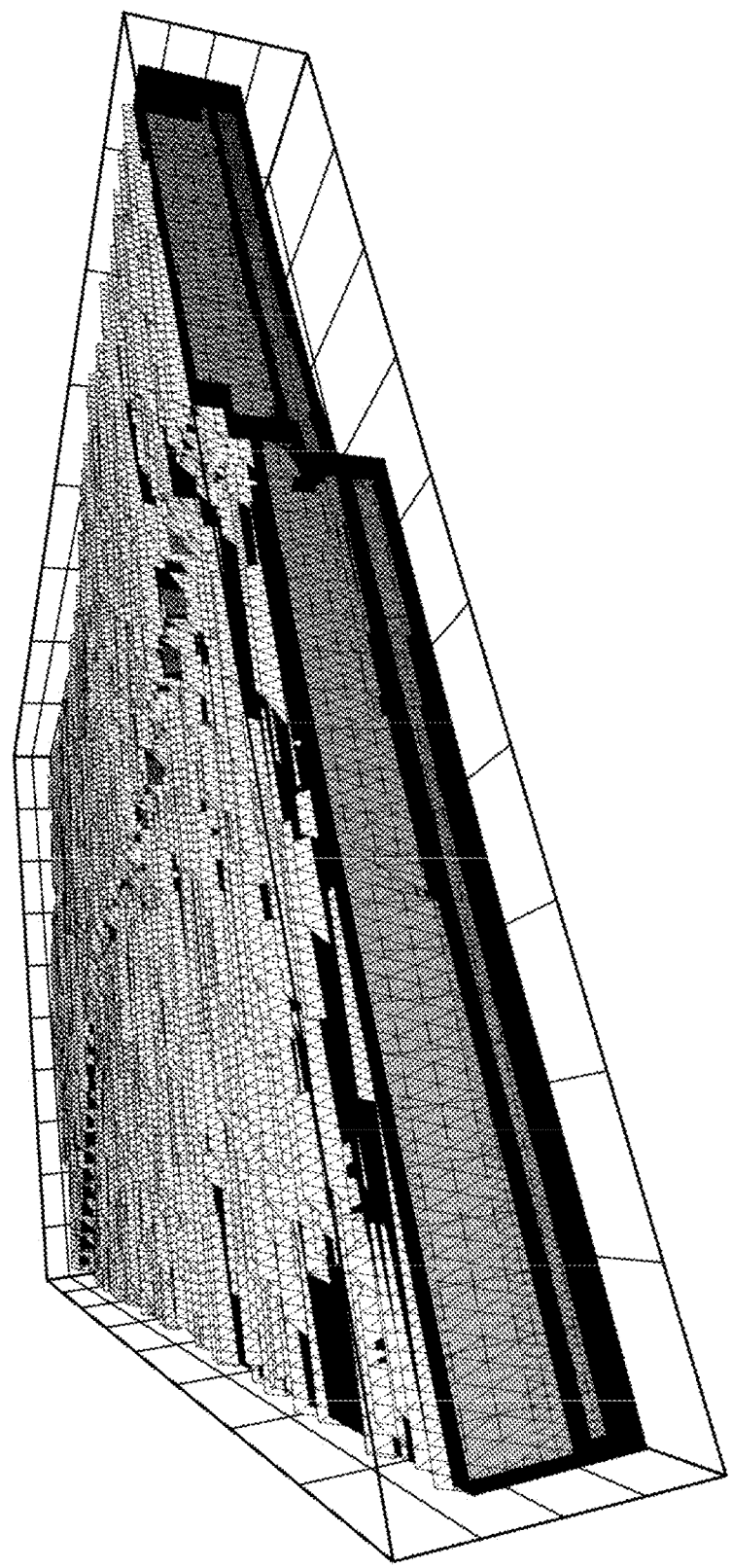

In FIG. 5C, fracture sets for the intervals in the 3D grid are created, as previously described. In this example, a 3D stratigraphic grid with 2 intervals is used. Both intervals of the stratigraphic grid have two fracture sets defined with the parameters similar to the examples herein bounded by surfaces. With all the data defining the fracture parameters now being entered (e.g., 3D grid bounding, fracture sets, etc.), the network simulation can be run using large and small triangle mesh sizes, as shown in FIG. 5D. In an alternative embodiment, the fracture network may be simulated to show network porosity inside the 3D grid. Moreover, if the provided 3D grid has existing properties, such as, for example, permeability, porosity or other properties (i.e., secondary data) obtained from seismic surveys, these properties can be used for generating secondary data to control the location of seed points for natural fractures.

FIGS. 6A-6D are screen shots of user interfaces useful to illustrate a method by which a fracture network is bounded by a structural framework, according to certain illustrative methods of the present disclosure. As previously described, illustrative embodiments of the present disclosure also support the creation of a fracture network inside a bounded region defined by a structural framework, such as, for example, faults or surfaces.

Figure 6A:
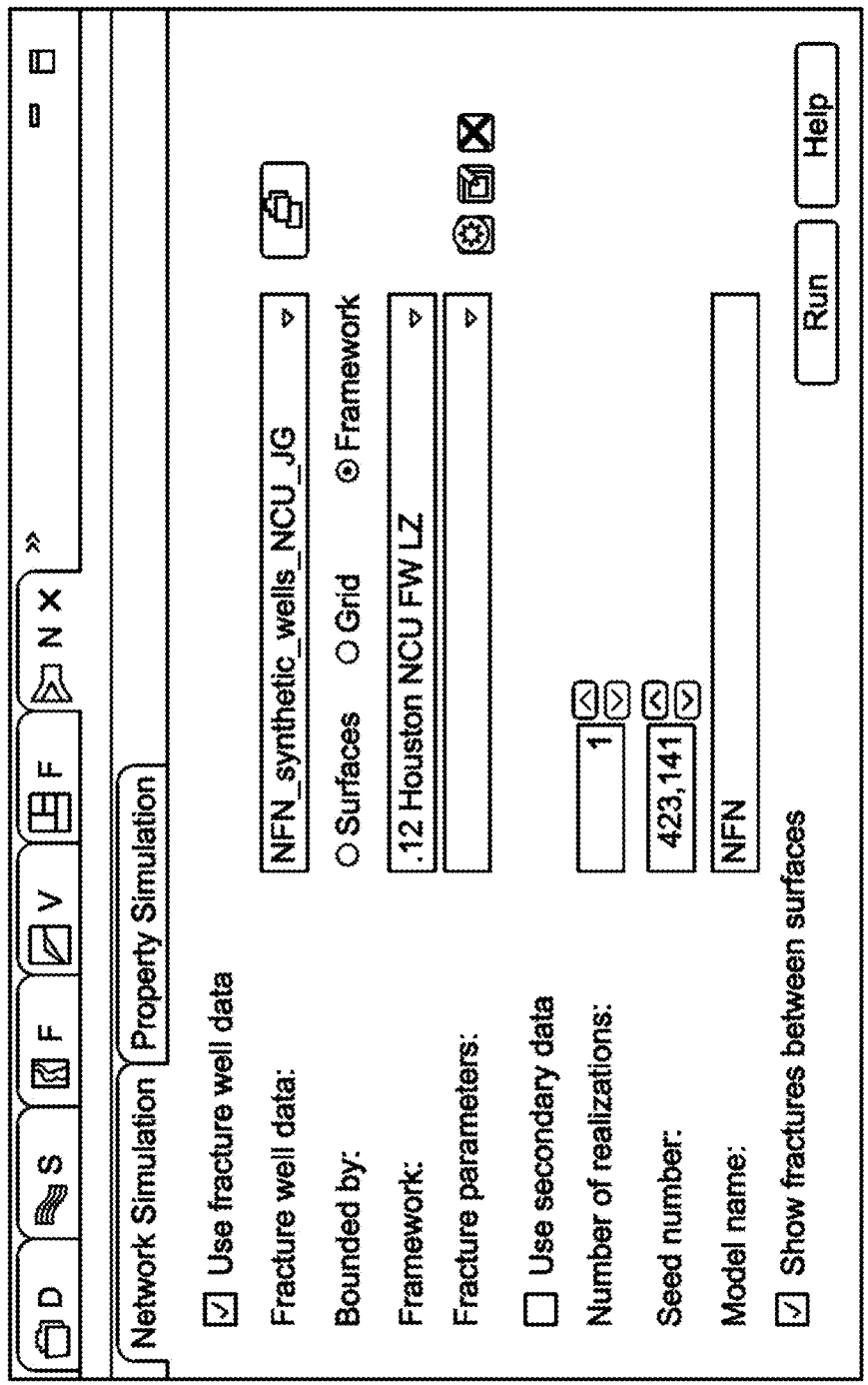
FIGS. 6A-6D are screen shots of user interfaces useful to illustrate a method by which a fracture network is bounded by a structural framework, according to certain illustrative methods of the present disclosure.
Figure 6B:
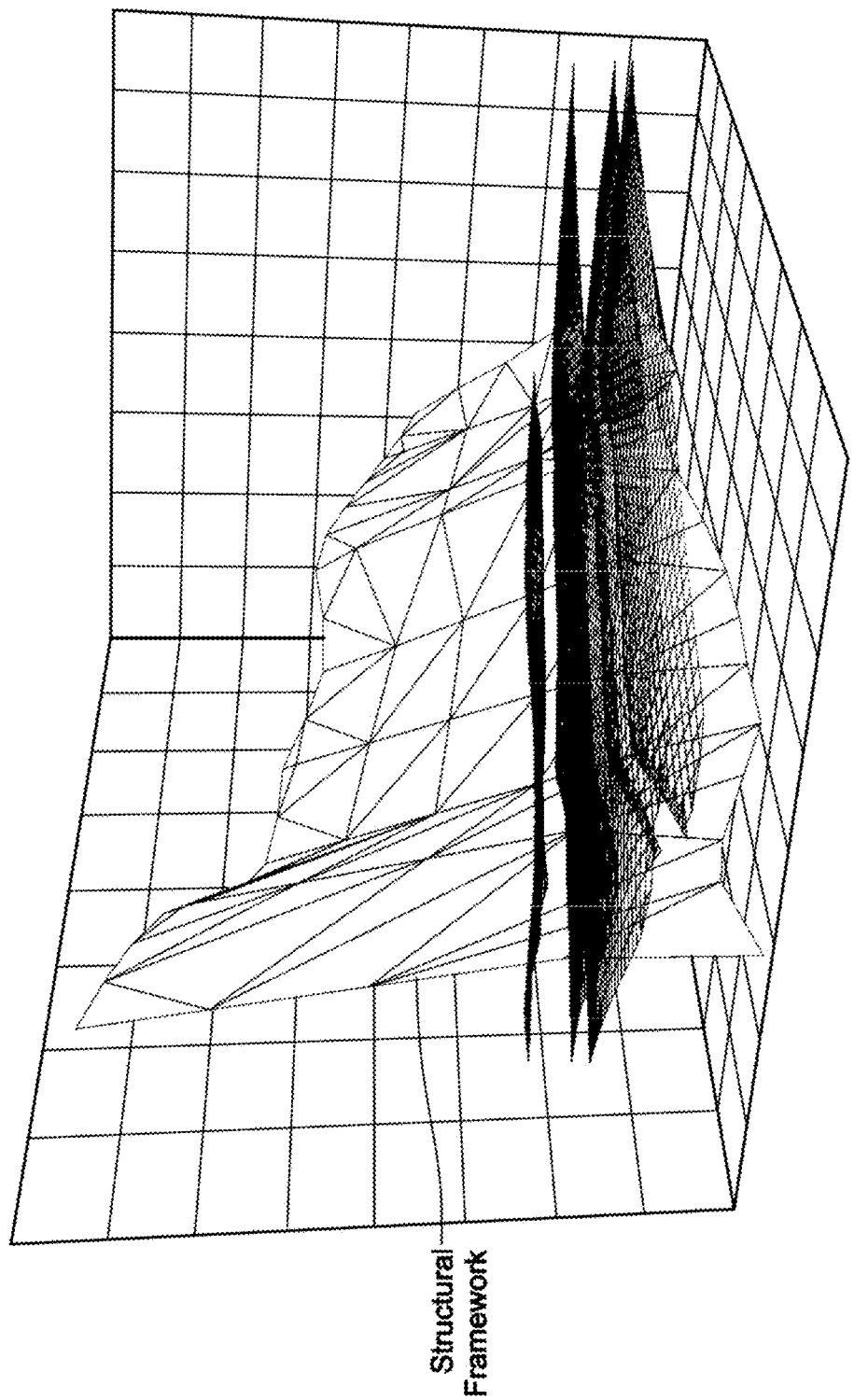

To begin this process, with reference to FIG. 6A, the bounded by "Framework" option is selected, the desired structural framework is loaded into the session, and the appropriate Fracture well data is selected for the structural framework. FIG. 6B illustrates a structural framework bounding a fracture network.

Figure 6C:
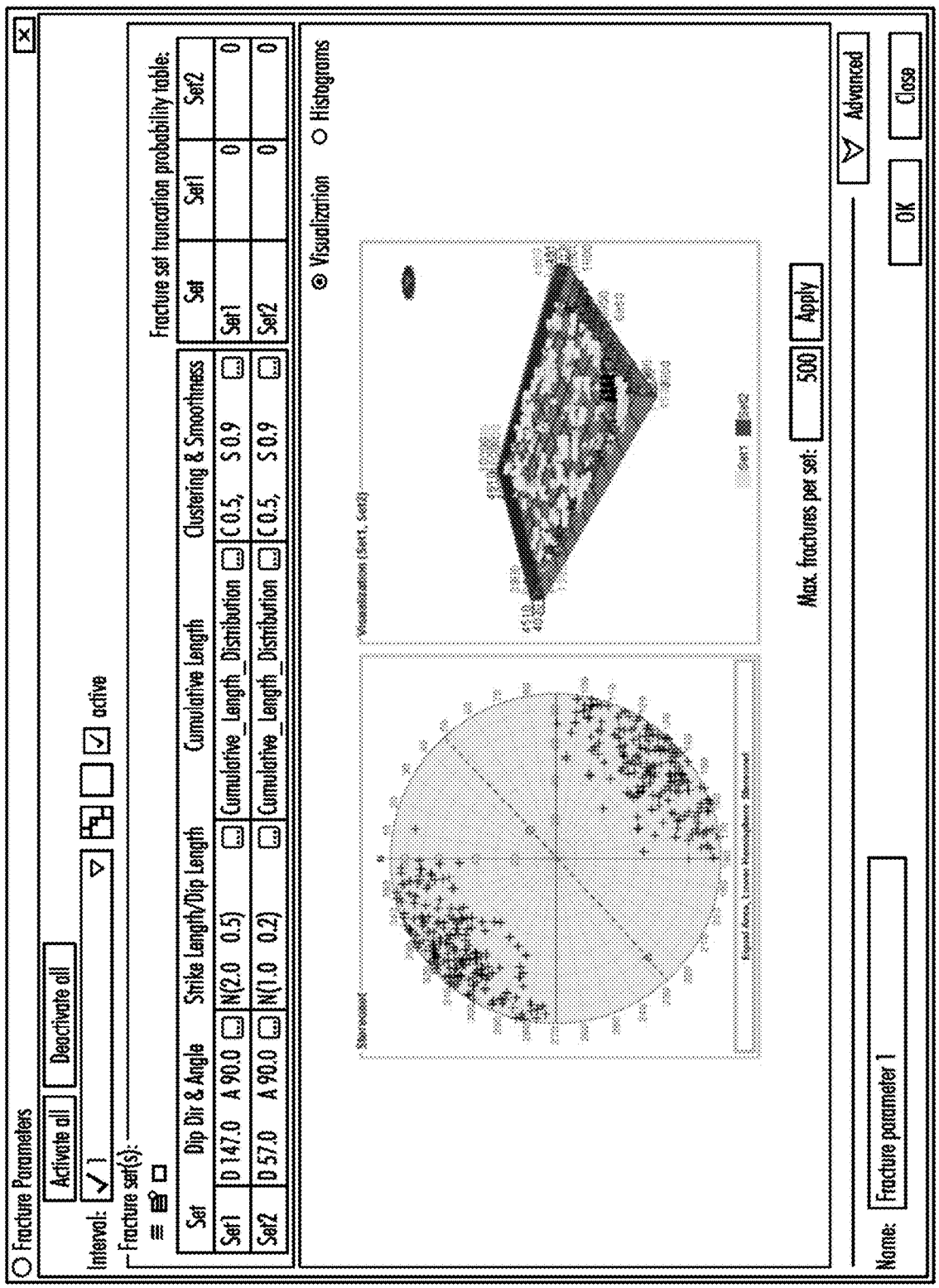
Figure 6D:
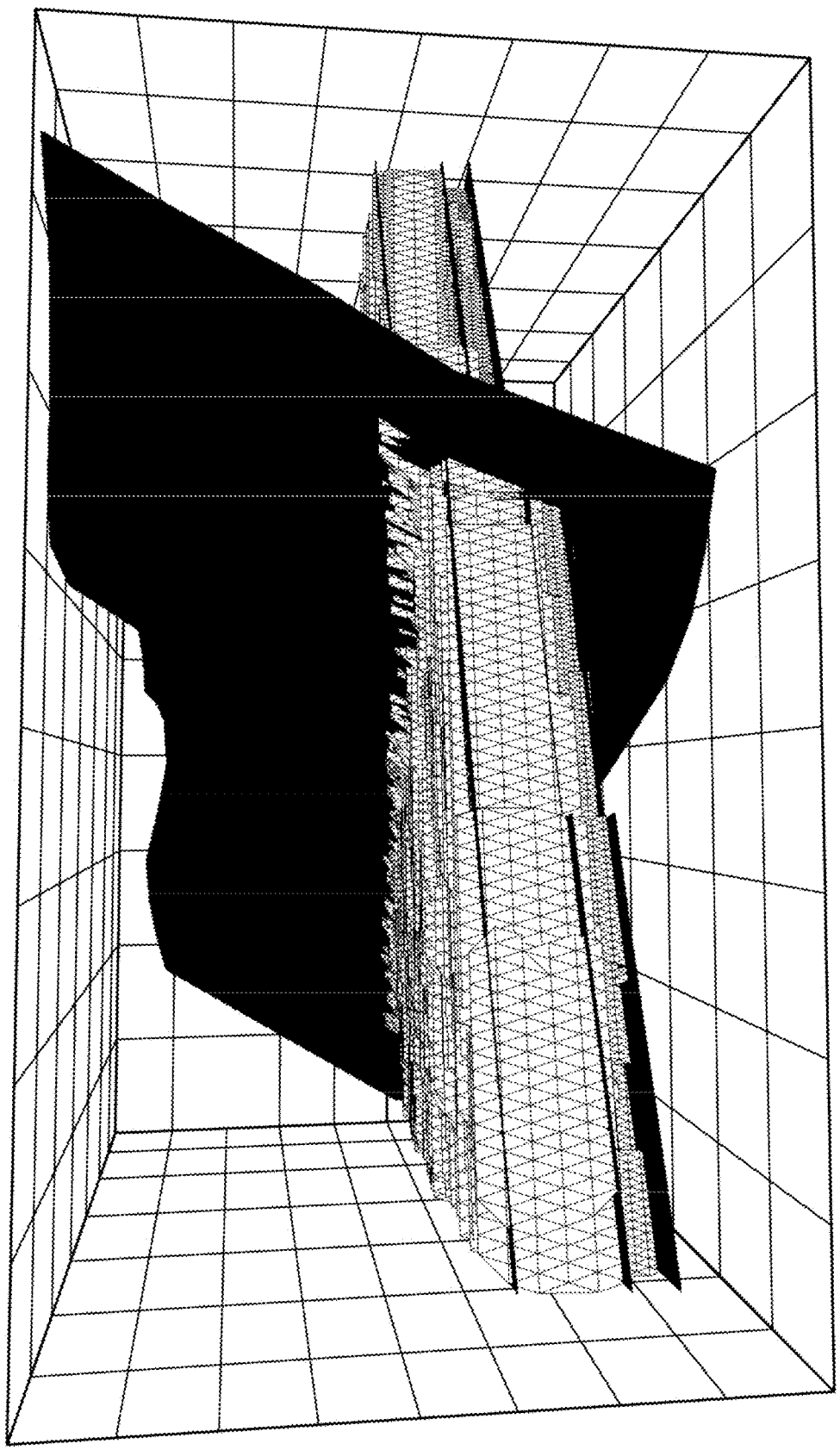

With reference to FIG. 6C, the fracture sets are then created for the intervals present in the structural framework, as previously described. In this example, a structural framework with two intervals is used. Both intervals of the structural framework have two fracture sets defined with the parameters similar to the "bounded by surfaces" examples discussed herein. Using the fracture parameters (e.g., fracture picks, 3D grid boundary, fracture sets, etc.), the network simulation can be run using small and large triangle mesh sizes, as shown in FIG. 6D. In other embodiments, similar to the bounded by "Surfaces" option, a 3D grid with properties can be used for generating secondary data to control the location of seed points for the natural fractures.

Embodiments of the present disclosure described herein further relate to any one or more of the following paragraphs:

1. A computer-implemented method for simulating a target object, the method comprising determining a seed point for the target object within a constraint volume, the seed point representing a vertex of a first triangle forming part of the target object; propagating one or more hexagonal orbits of triangles adjacent the first triangle, whereby the hexagonal orbits of triangles form the target object; determining a size of each triangle based upon dimensions of the target object; and generating the target object.

2. A computer-implemented method as defined in paragraph 1, wherein determining the size of each triangle comprises: defining a maximum number of hexagonal orbits; and if a number of the propagated hexagonal orbits exceeds the maximum number of hexagonal orbits, setting the number of propagated hexagonal orbits to the maximum number of hexagonal orbits, thereby determining a size of each triangle.

3. A computer-implemented method as defined in paragraphs 1 or 2, wherein determining the size of each triangle comprises defining a maximum number of hexagonal orbits; and if a number of the propagated hexagonal orbits does not exceed the maximum number of hexagonal orbits, determining the size of the triangle based upon the dimensions of the target object.

4. A computer-implemented method as defined in any of paragraphs 1-3, wherein the target object is a fracture in a subsurface fracture network.

5. A computer-implemented method as defined in any of paragraphs 1-4, wherein determining the seed point comprises selecting a seed point located in a region of the constraint volume where a fracture is located; and selecting a seed point, whereby a fracture resulting from the seed point may be centered on the seed point.

6. A computer-implemented method as defined in any of paragraphs 1-5, wherein determining the seed point comprises: utilizing wellbore survey data to determine a location of fractures in the constraint volume; and selecting the seed point based upon the survey data.

7. A computer-implemented method as defined in any of paragraphs 1-6, wherein the generated target object is utilized to simulate a subsurface fracture network.

8. A computer-implemented method for simulating a target object, the method comprising simulating different target objects in a simulated network using differing triangle mesh sizes.

9. A computer-implemented method as defined in paragraph 8, wherein the target objects are utilized to simulate a subsurface fracture network.

10. A computer-implemented method as defined in paragraphs 8 or 9, wherein simulating the different target objects comprises: determining a seed point for the target object within a constraint volume, the seed point representing a vertex of a first triangle forming part of the target object; propagating one or more hexagonal orbits of triangles adjacent the first triangle, whereby the hexagonal orbits of triangles form the target object; determining a size of each triangle based upon dimensions of the target object; an generating the target object.

11. A computer-implemented method as defined in any of paragraphs 8-10, wherein determining the size of each triangle comprises: defining a maximum number of hexagonal orbits; and if a number of the propagated hexagonal orbits exceeds the maximum number of hexagonal orbits, setting the number of propagated hexagonal orbits to the maximum number of hexagonal orbits, thereby determining a size of each triangle.

12. A computer-implemented method as defined in any of paragraphs 8-11, wherein determining the size of each triangle comprises defining a maximum number of hexagonal orbits; and if a number of the propagated hexagonal orbits does not exceed the maximum number of hexagonal orbits, determining the size of the triangle based upon the dimensions of the target object.

13. A computer-implemented method as defined in any of paragraphs 8-12, wherein the target object is a fracture in a subsurface fracture network.

14. A computer-implemented method as defined in any of paragraphs 8-13, wherein determining the seed point comprises: selecting a seed point located in a region of the constraint volume where a fracture is located; and selecting a seed point whereby a fracture resulting from the seed point may be centered on the seed point.

15. A computer-implemented method as defined in any of paragraphs 8-14, wherein determining the seed point comprises: utilizing wellbore survey data to determine a location of fractures in the constraint volume; and selecting the seed point based upon the survey data.

Moreover, the foregoing paragraphs and other methods described herein may be embodied within a system comprising processing circuitry to implement any of the methods, or a in a computer readable medium comprising instructions which, when executed by at least one processor, causes the processor to perform any of the methods described herein.

Although various embodiments and methods have been shown and described, the present disclosure is not limited to such embodiments and methodologies and will be understood to include all modifications and variations as would be apparent to one skilled in the art. Therefore, it should be understood that this disclosure is not intended to be limited to the particular forms disclosed. Rather, the intention is to cover all modifications, equivalents and alternatives falling within the spirit and scope of the disclosure as defined by the appended claims.

What is claimed is:

1. A computer-implemented method for simulating a target object, the method comprising:
   determining a seed point for the target object within a constraint volume, the target object being a fracture in a subsurface fracture network, wherein:
   the seed point represents a vertex of a first triangle forming part of the target object; and
   the seed point represents an origination point for a triangle mesh which propagates out from the seed point in a hexagonal orbit around the seed point;
   propagating one or more hexagonal orbits of triangles out from the seed point adjacent the first triangle, whereby the hexagonal orbits of triangles form the target object;
   determining a size of each triangle based upon dimensions of the target object; and
   generating the target object,
   wherein determining the size of each triangle comprises:
   defining a maximum number of hexagonal orbits;
   if a number of the propagated hexagonal orbits exceeds the maximum number of hexagonal orbits, setting the number of propagated hexagonal orbits to the maximum number of hexagonal orbits, thereby determining a size of each triangle; and
   if a number of the propagated hexagonal orbits does not exceed the maximum number of hexagonal orbits, determining the size of the triangle based upon the dimensions of the target object.

2. A computer-implemented method as defined in claim 1, wherein determining the seed point comprises:
   selecting a seed point located in a region of the constraint volume where a fracture is located; and
   selecting a seed point, whereby a fracture resulting from the seed point may be centered on the seed point.

3. A computer-implemented method as defined in claim 1, wherein determining the seed point comprises:
   utilizing wellbore survey data to determine a location of fractures in the constraint volume; and
   selecting the seed point based upon the survey data.

4. A computer-implemented method as defined in claim 1, wherein the generated target object is utilized to simulate a subsurface fracture network.

5. A computer-implemented method for simulating a target object, the method comprising simulating different target objects in a simulated network using differing triangle mesh sizes having triangles therein, wherein determining a size of each triangle in comprises:
   defining a maximum number of hexagonal orbits;
   if a number of propagated hexagonal orbits exceeds the maximum number of hexagonal orbits, setting the number of propagated hexagonal orbits to the maximum number of hexagonal orbits, thereby determining a size of each triangle; and
   if a number of the propagated hexagonal orbits does not exceed the maximum number of hexagonal orbits, determining the size of the triangle based upon the dimensions of the target object, and
   wherein the target objects are utilized to simulate a subsurface fracture network.

6. A computer-implemented method as defined in claim 5, wherein simulating the different target objects comprises:
   determining a seed point for the target object within a constraint volume, the seed point representing a vertex of a first triangle forming part of the target object;
   propagating one or more hexagonal orbits of triangles adjacent the first triangle, whereby the hexagonal orbits of triangles form the target object;
   determining a size of each triangle based upon dimensions of the target object; and
   generating the target object.

7. A computer-implemented method as defined in claim 6, wherein the target object is a fracture in a subsurface fracture network.

8. A computer-implemented method as defined in claim 7, wherein determining the seed point comprises:
   selecting a seed point located in a region of the constraint volume where a fracture is located; and
   selecting a seed point whereby a fracture resulting from the seed point may be centered on the seed point.

9. A computer-implemented method as defined in claim 7, wherein determining the seed point comprises:
   utilizing wellbore survey data to determine a location of fractures in the constraint volume; and
   selecting the seed point based upon the survey data.

10. A system comprising processing circuitry to implement the method comprising:
    determining a seed point for the target object within a constraint volume, the target object bring a fracture in a subsurface fracture network, wherein:
    the seed point represents a vertex of a first triangle forming part of the target object; and the seed point represents an origination point for a triangle mesh which propagates out from the seed point In a hexagonal orbit around the seed point;

propagating one or more hexagonal orbits of triangles out from the seed point adjacent the first triangle, whereby the hexagonal orbits of triangles form the target object;

determining a size of each triangle based upon dimensions of the target object; and generating the target object, wherein determining the size of each triangle comprises:
defining a maximum number of hexagonal orbits;
if a number of the propagated hexagonal orbits exceeds the maximum number of hexagonal orbits, setting the number of propagated hexagonal orbits to the maximum number of hexagonal orbits, thereby determining a size of each triangle; and
if a number of the propagated hexagonal orbits does not exceed the maximum number of hexagonal orbits, determining the size of the triangle based upon the dimensions of the target object.

11. A computer-readable storage medium having computer-readable instructions stored thereon, which when executed by at least one processor causes the processor to perform the method comprising:

determining a seed point for the target object within a constraint volume, the target object being a fracture in a subsurface fracture network, wherein:

the seed point represents a vertex of a first triangle forming part of the target object; and the seed point represents an origination point for a triangle mesh which propagates out from the seed point in a hexagonal orbit around the seed point;

propagating one or more hexagonal orbits of triangles out from the seed point adjacent the first triangle, whereby the hexagonal orbits of triangles form the target object;

determining a size of each triangle based upon dimensions of the target object;

and generating the target object, wherein determining the size of each triangle comprises:

defining a maximum number of hexagonal orbits;

if a number of the propagated hexagonal orbits exceeds the maximum number of hexagonal orbits, setting the number of propagated hexagonal orbits to the maximum number of hexagonal orbits, thereby determining a size of each triangle; and if a number of the propagated hexagonal orbits does not exceed the maximum number of hexagonal orbits, determining the size of the triangle based upon the dimensions of the target object.

* * * * *